(12) United States Patent
Kim et al.

(10) Patent No.: US 12,557,582 B2
(45) Date of Patent: Feb. 17, 2026

(54) LASER PRESSURE HEAD MODULE AND LASER BONDING APPARATUS INCLUDING THE SAME

(71) Applicant: Samsung Display Co., LTD., Yongin-si (KR)

(72) Inventors: Jong Hyup Kim, Yongin-si (KR); Jin Pyung Lee, Yongin-si (KR); Gil Jun Kim, Yongin-si (KR); Yong Hwan Kim, Yongin-si (KR); Min Ho Bae, Yongin-si (KR); Hae Wook Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 304 days.

(21) Appl. No.: 18/186,876

(22) Filed: Mar. 20, 2023

(65) Prior Publication Data
US 2023/0360934 A1  Nov. 9, 2023

(30) Foreign Application Priority Data

May 9, 2022 (KR) .................. 10-2022-0056508

(51) Int. Cl.
*H01L 21/67* (2006.01)
*B30B 5/02* (2006.01)

(52) U.S. Cl.
CPC .......... *H01L 21/67121* (2013.01); *B30B 5/02* (2013.01); *H01L 2224/751* (2013.01); *H01L 2224/75263* (2013.01)

(58) Field of Classification Search
CPC ......... H01L 21/67121; H01L 21/67098; H01L 21/67115; B30B 5/02; B30B 9/22; B29C 51/28; G02F 1/133305; G02F 1/1333
See application file for complete search history.

(56) References Cited

FOREIGN PATENT DOCUMENTS

| CN | 103477424 A | * | 12/2013 | ........... B23K 1/0056 |
|---|---|---|---|---|
| CN | 108637470 A | * | 10/2018 | ........... B23K 26/042 |
| EP | 2764981 A1 | * | 8/2014 | ............ B29C 65/16 |
| JP | 11-297764 A | | 10/1999 | |
| KR | 10-2011-0131522 A | | 12/2011 | |
| KR | 10-1177292 B1 | | 8/2012 | |
| KR | 10-2199450 B1 | | 1/2021 | |

OTHER PUBLICATIONS

Translation CN-103477424-A, Azdasht, Dec. 2013.*
Translation CN-108637470-A, Sun, Oct. 2018.*
Translation EP-2764981-A1, Wollmann, Aug. 2014.*

* cited by examiner

*Primary Examiner* — Philip C Tucker
*Assistant Examiner* — Jimmy R Smith, Jr.
(74) *Attorney, Agent, or Firm* — Womble Bond Dickinson (US) LLP

(57) ABSTRACT

A laser pressure head module including: a pressure member including: a first light-transmitting member; a second light-transmitting member; and a sealed space between the first light-transmitting member and the second light-transmitting member; and a gas supply unit to supply gas to the sealed space to generate a pressing force. The second light-transmitting member is to be expanded or moved in an external direction by the pressing force.

28 Claims, 21 Drawing Sheets

P310: P311, P312, P313, P314, P315

2310: 311, 312, 317, 319, 330

LASER PRESSURE HEAD MODULE AND LASER BONDING APPARATUS INCLUDING THE SAME

CROSS-REFERENCE TO RELATED APPLICATION

This application claims priority to and the benefit of Korean Patent Application No. 10-2022-0056508, filed on May 9, 2022, in the Korean Intellectual Property Office, the entire disclosure of which is incorporated by reference herein.

BACKGROUND

1. Field

Aspects of embodiments of the present disclosure relate to a laser pressure head module, and a laser bonding apparatus including the laser pressure head module.

2. Description of the Related Art

With the advancement of the information age, the demand for a display device for displaying an image has increased with various forms. For example, the display device may be a flat panel display device, such as a liquid crystal display device, a field emission display device, and a light emitting display device.

When a display device is manufactured to have a large size, a defect rate of a light emitting element may be increased, due to an increase in the number of pixels, and thus, productivity and/or reliability may be deteriorated. Accordingly, a tiled display device has been developed, in which a large-sized screen is implemented by connecting a plurality of display devices having a relatively smaller size screen to one another.

The above information disclosed in this Background section is for enhancement of understanding of the background of the present disclosure, and therefore, it may contain information that does not constitute prior art.

SUMMARY

A semiconductor device or the like may be bonded to a substrate by laser bonding. Laser bonding is performed, such that a laser beam is irradiated to the semiconductor device while the semiconductor device on the substrate is being pressed by a pressure member.

In this case, because heat is applied to the pressure member, thermal deformation may occur in the pressure member. Such thermal deformation may cause non-contact between the substrate and the semiconductor device, or a distortion in an alignment of the semiconductor device. Thus, an uneven pressing force may be transferred to the semiconductor device. In addition, as an area of the pressure member is increased, it may be more difficult to manage a flatness and parallelism for processing.

One or more embodiments of the present disclosure are directed to a laser pressure head module for uniformly or substantially uniformly pressing a substrate and a semiconductor device, and a laser bonding apparatus including the laser pressure head module.

However, the aspects and features of the present disclosure are not restricted to the ones set forth herein. The above and other aspects and features of the present disclosure will become more apparent to those having ordinary skill in the art to which the present disclosure pertains by referring to the below detailed description with reference to the figures.

According to one or more embodiments of the present disclosure, a laser pressure head module includes: a pressure member including: a first light-transmitting member; a second light-transmitting member; and a sealed space between the first light-transmitting member and the second light-transmitting member; and a gas supply unit configured to supply gas to the sealed space to generate a pressing force. The second light-transmitting member is configured to be expanded or moved in an external direction by the pressing force.

In an embodiment, the second light-transmitting member may overlap with the first light-transmitting member in a thickness direction.

In an embodiment, the first light-transmitting member may include a rigid material, and the second light-transmitting member may include an elastic material.

In an embodiment, the first light-transmitting member may have a chamfer shape in which an edge of a rear surface of the first light-transmitting member facing the second light-transmitting member may have an obliquely cut shape.

In an embodiment, the first light-transmitting member may include a light-shielding area including a light-shielding material at the edge of the first light-transmitting member having the chamfer shape.

In an embodiment, the second light-transmitting member may include a light-shielding area including a light-shielding material at an area overlapping with the edge of the first light-transmitting member having the chamfer shape.

In an embodiment, the laser pressure head may further include a third light-transmitting member between the first light-transmitting member and the second light-transmitting member, the third light-transmitting member including an elastic material, and the sealed space may be located between the second light-transmitting member and the third light-transmitting member.

In an embodiment, the laser pressure head may further include an elongation member connecting the first light-transmitting member with the second light-transmitting member, and surrounding the sealed space, and the elongation member may be configured to be elongated in a direction towards the second light-transmitting member by the pressing force.

In an embodiment, the elongation member may include a bellows.

In an embodiment, the first light-transmitting member and the second light-transmitting member may include a rigid material.

In an embodiment, the second light-transmitting member may have a chamfer shape in which an edge of one surface of the second light-transmitting member may have an obliquely cut shape.

In an embodiment, the second light-transmitting member may include a light-shielding area including a light-shielding material at the edge of the second light-transmitting member having the chamfer shape.

In an embodiment, the pressing force may be 0.5 Mpa to 1 MPa.

In an embodiment, the gas supply unit may include: a reservoir configured to store gas; a gas pump configured to supply the gas by pressurizing the gas; a gas valve configured to control a flow of the gas; and a gas supply conduit providing a path through which the gas is supplied into the sealed space.

In an embodiment, at least one of the first light-transmitting member or the second light-transmitting member may have a through hole for connecting the gas supply conduit with the sealed space.

According to one or more embodiments of the present disclosure, a laser bonding apparatus includes: a support member having an upper surface extending in a first direction and a second direction crossing the first direction, the support member configured to receive bonding targets seated on the upper surface; a pressure member on an upper portion of the support member, the pressure member including: a first light-transmitting member; a second light-transmitting member; and a sealed space between the first light-transmitting member and the second light-transmitting member; a gas supply unit configured to supply gas to the sealed space to generate a pressing force; and a laser generator on the pressure member, and configured to irradiate a laser beam to the bonding targets in a third direction crossing the first and second directions. The second light-transmitting member is configured to move in an external direction by the pressing force to press the bonding targets.

In an embodiment, the first light-transmitting member and the second light-transmitting member may overlap with the support member in a plan view.

In an embodiment, the first light-transmitting member may include a rigid material, and the second light-transmitting member may include an elastic material.

In an embodiment, laser bonding apparatus may further include a third light-transmitting member between the first light-transmitting member and the second light-transmitting member, and including an elastic material, and the sealed space may be located between the second light-transmitting member and the third light-transmitting member.

In an embodiment, laser bonding apparatus may further include an elongation member connecting the first light-transmitting member with the second light-transmitting member, and surrounding the sealed space, and the elongation member may be configured to be elongated in a direction towards the second light-transmitting member by the pressing force.

In an embodiment, the first light-transmitting member and the second light-transmitting member may include a rigid material.

In an embodiment, the bonding targets may include: a first bonding target; a second bonding target on the first bonding target; and an adhesive member adhering the first bonding target to the second bonding target.

In an embodiment, the laser generator may be configured to heat an area of a bonding target from among the bonding targets.

In an embodiment, the laser generator may be configured to irradiate a laser beam to the bonding target from among the bonding targets, while the second light-transmitting member may be pressing the bonding targets.

In an embodiment, the laser bonding apparatus may further include a frame having an accommodating space for accommodating the first light-transmitting member and the second light-transmitting member, and an opening exposing one surface of the first light-transmitting member.

In an embodiment, the frame may include: a main frame having a rectangular frame shape surrounding the opening; and four side frames vertically connected to four sides of the main frame to form the accommodating space.

In an embodiment, the main frame may include a light-shielding member on an upper surface facing a laser irradiating direction of the laser generator.

According to one or more embodiments of the present disclosure, in the laser pressure head module and the laser bonding apparatus including the same, the substrate and the semiconductor device may be uniformly or substantially uniformly pressed.

According to one or more embodiments of the present disclosure, because deformation of a transmissive member may not affect uniform pressurization, a large area uniform pressurization may be possible.

However, the aspects and features of the present disclosure are not limited to the aforementioned aspects and features, and various other aspects and features may be included in the present specification.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
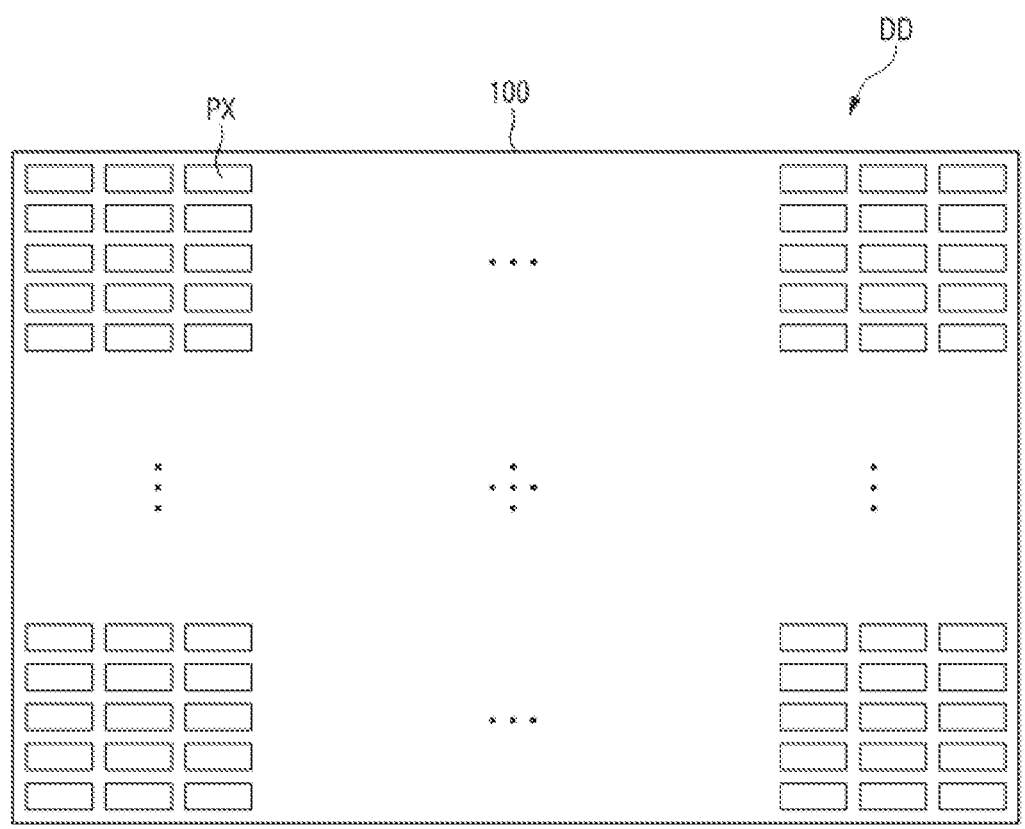
FIG. 1 is a layout view illustrating a display device according to an embodiment.
Figure 1:
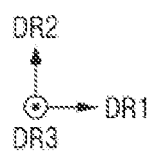

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, the expression "in a plan view" may refer to a view of an object portion from above, and the expressions "in a cross-sectional view" and "in a schematic cross-sectional view" may refer to a view from the side of a schematic cross-section taken by vertically cutting an object portion. The terms "overlap with," "overlapping with," and "overlapped with" may refer to a first object that may be above or below or at a side of a second object, and vice versa. Additionally, these overlap terms may include layer, stack, face or facing, extending over, covering, or partly covering, or any other suitable term as would be appreciated and understood by those of ordinary skill in the art. The expression "not overlap with" may include the expressions "spaced from," "apart from," "set aside from," or "offset from," as well as any other suitable equivalents as would be appreciated and understood by those of ordinary skill in the art. The terms "face" and "facing" may refer to a first object that may be directly or indirectly opposed to a second object. In a case in which a third object intervenes between a first object and a second object, the first and second objects may be understood as being indirectly opposed to one another, although still facing each other.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of" when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," "approximately," and similar terms are used as terms of approximation and not as terms of degree, and are intended to account for the inherent variations in measured or calculated values that would be recognized by those of ordinary skill in the art. For example, "about" may mean within one or more standard deviations, or within ±30%, 20%, 10%, 5% of the stated value. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
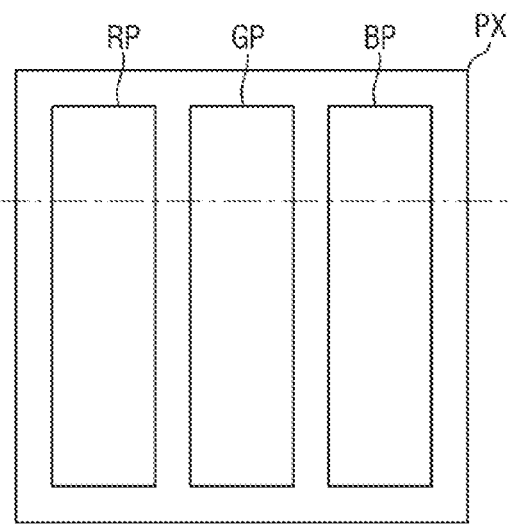
FIG. 2 is a view illustrating an example of a pixel of FIG. 1.
Figure 3:
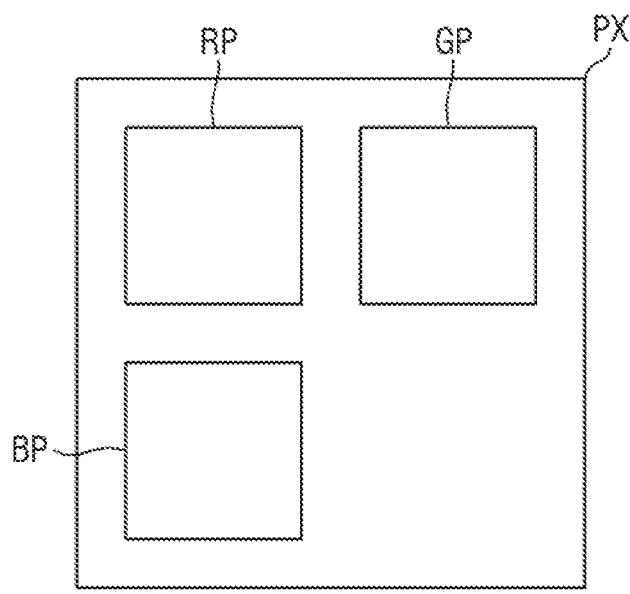
FIG. 3 is a view illustrating another example of a pixel of FIG. 1.

FIG. 1 is a layout view illustrating a display device according to an embodiment. FIG. 2 is a view illustrating an example of a pixel of FIG. 1. FIG. 3 is a view illustrating another example of a pixel of FIG. 1.

Referring to FIGS. 1 through 3, a display device DD is a device that displays a moving image and/or a still image. The display device DD may be used as a display screen for various suitable products, such as a television, a laptop computer, a monitor, an advertising board, an Internet of things (IoT) device, and the like, as well as for various suitable portable electronic devices, such as a mobile phone, a smart phone, a tablet personal computer (PC), a smart watch, a watch phone, a mobile communication terminal, an electronic notebook, an electronic book, a portable multimedia player (PMP), a navigator, an ultra mobile PC (UMPC), and the like.

A display panel 100 may be formed in a rectangular shaped plane having a long side extending in a first direction DR1, and a short side extending in a second direction DR2 crossing the first direction DR1. A corner where the long side extending in the first direction DR1 and the short side extending in the second direction DR2 meet each other may be rounded to have a suitable curvature (e.g., a predetermined curvature), or may be formed at a right angle. A planar shape of the display panel 100 is not limited to a rectangle, and may be formed in another suitable polygonal shape, a circular shape, or an elliptical shape. The display panel 100 may be formed to be flat or substantially flat, but the present disclosure is not limited thereto. For example, the display panel 100 may include a curved portion formed at left and right ends, and the curved portion may have a constant or substantially constant curvature, or a variable curvature. In addition, the display panel 100 may be flexibly formed to be curved, bent, folded, or rolled.

The display panel 100 may further include a plurality of pixels PX for displaying an image, scan lines extended in the first direction DR1, and data lines extended in the second direction DR2. The pixels PX may be arranged in the form of a matrix along the first direction DR1 and the second direction DR2.

Each of the pixels PX may include a plurality of subpixels RP, GP, and BP as shown in FIGS. 2 and 3. Although FIG. 2 and FIG. 3 illustrate that each of the pixels PX includes three subpixels RP, GP and BP (e.g., a first subpixel RP, a second subpixel GP, and a third subpixel BP), the present disclosure is not limited thereto.

The first subpixel RP, the second subpixel GP, and the third subpixel BP may be connected to any one of the data lines, and to at least one of the scan lines.

Each of the first subpixel RP, the second subpixel GP, and the third subpixel BP may have a rectangular planar shape, a square planar shape, or a rhombus planar shape. For example, each of the first subpixel RP, the second subpixel GP, and the third subpixel BP may have a rectangular planar shape having a short side extending in the first direction DR1, and a long side extending in the second direction DR2, as shown in FIG. 2. As another example, each of the first subpixel RP, the second subpixel GP, and the third subpixel BP may have a square or rhombus planar shape having sides of the same or substantially the same length as each other in the first direction DR1 and the second direction DR2, as shown in FIG. 3.

As shown in FIG. 2, the first subpixel RP, the second subpixel GP, and the third subpixel BP may be arranged along the first direction DR1. As another example, the first subpixel RP and any one of the second subpixel GP and the third subpixel BP may be arranged along the first direction DR1, and the first subpixel RP and the other one of the second subpixel GP and the third subpixel BP may be arranged along the second direction DR2. For example, as shown in FIG. 3, the first subpixel RP and the second subpixel GP may be arranged along the first direction DR1, and the first subpixel RP and the third subpixel BP may be arranged along the second direction DR2.

As another example, the second subpixel GP and any one of the first subpixel RP and the third subpixel BP may be arranged along the first direction DR1, and the second subpixel GP and the other one of the first subpixel RP and the third subpixel BP may be arranged along the second direction DR2. As another example, the third subpixel BP and any one of the first subpixel RP and the second subpixel GP may be arranged along the first direction DR1, and the third subpixel BP and the other one of the first subpixel RP and the second subpixel GP may be arranged along the second direction DR2.

The first subpixel RP may include a first light emitting element that emits first light (e.g., first color light), the second subpixel GP may include a second light emitting element that emits second light (e.g., second color light), and the third subpixel BP may include a third light emitting element that emits third light (e.g., third color light). In this case, the first light may be light of a red wavelength band, the second light may be light of a green wavelength band, and the third light may be light of a blue wavelength band. The red wavelength band may be a wavelength band of approximately 600 nm to 750 nm, the green wavelength band may be a wavelength band of approximately 480 nm to 560 nm, and the blue wavelength band may be a wavelength band of approximately 370 nm to 460 nm, but the present disclosure is not limited thereto.

Each of the first subpixel RP, the second subpixel GP and the third subpixel BP may include an inorganic light emitting element having an inorganic semiconductor as a light emitting element for emitting light. For example, the inorganic light emitting element may be a flip chip type micro light emitting diode (LED), but the present disclosure is not limited thereto.

As shown in FIGS. 2 and 3, an area (e.g., a size) of the first subpixel RP, an area (e.g., a size) of the second subpixel GP, and an area (e.g., a size) of the third subpixel BP may be the same or substantially the same as one another, but the present disclosure is not limited thereto. At least one of the area of the first subpixel RP, the area of the second subpixel GP, or the area of the third subpixel BP may be different from another one. In some embodiments, any two of the area of the first subpixel RP, the area of the second subpixel GP, and the area of the third subpixel BP may be the same or substantially the same as each other, and the remaining one may be different from the two. In some embodiments, the area of the first subpixel RP, the area of the second subpixel GP, and the area of the third subpixel BP may be different from one another.

Figure 4:
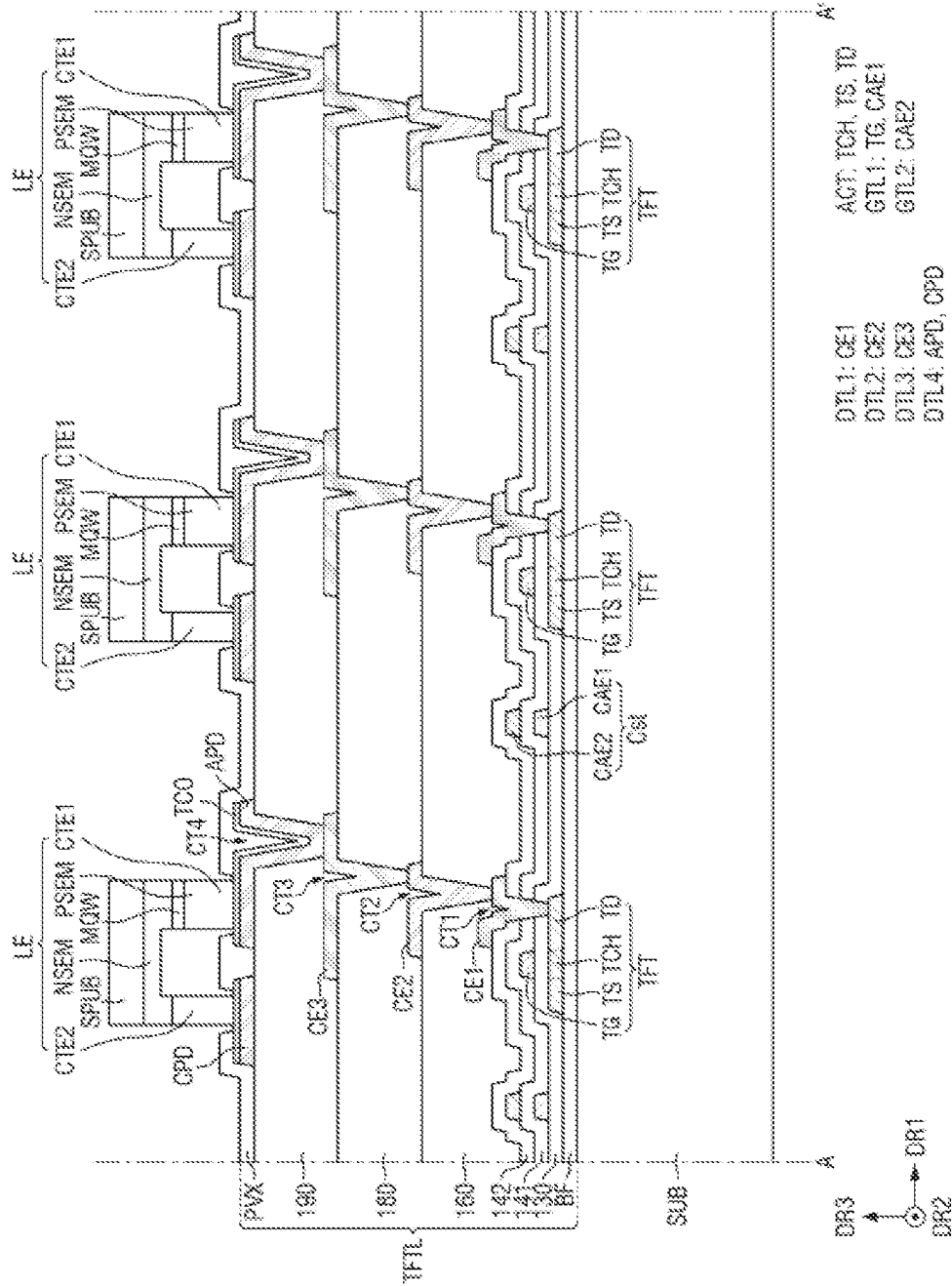
FIG. 4 is a cross-sectional view illustrating an example of a display panel taken along the line A-A' of FIG. 2.

FIG. 4 is a cross-sectional view illustrating an example of a display panel taken along the line A-A' of FIG. 2.

Referring to FIGS. 2 and 4, the display panel 100 may include a thin film transistor layer TFTL disposed on a substrate SUB, and light emitting elements LE. The thin film transistor layer TFTL may be a layer in which thin film transistors TFT are formed.

The thin film transistor layer TFTL includes an active layer ACT, a first gate layer GTL1, a second gate layer GTL2, a first data metal layer DTL1, a second data metal layer DTL2, a third data metal layer DTL3, and a fourth data metal layer DTL4. In addition, the thin film transistor layer TFTL includes a buffer layer BF, a gate insulating layer 130, a first interlayer insulating layer 141, a second interlayer insulating layer 142, a first planarization layer 160, and a second planarization layer 180.

The substrate SUB may be a base substrate or a base member for supporting the display device DD. The substrate SUB may be a rigid substrate including (e.g., made of) a glass material, but the present disclosure is not limited thereto. The substrate SUB may be a flexible substrate capable of being subjected to bending, folding, rolling, or the like. In this case, the substrate SUB may include an insulating material, such as a polymer resin. The polymer resin may include (e.g., may be), for example, polyimide (PI).

The buffer layer BF may be disposed on one surface of the substrate SUB. The buffer layer BF may be a layer for preventing or substantially preventing permeation of the air and/or water. The buffer layer BF may include (e.g., may be made of) a plurality of inorganic layers that are alternately stacked. For example, the buffer layer BF may include (e.g., may be formed of) multi-layers in which one or more inorganic layers of a silicon nitride layer, a silicon oxynitride layer, a silicon oxide layer, a titanium oxide layer, and/or an aluminum oxide layer are alternately stacked. However, the present disclosure is not limited thereto, and the buffer layer BF may be omitted as needed or desired.

The active layer ACT may be disposed on the buffer layer BF. The active layer ACT may include a silicon semiconductor, such as polycrystalline silicon, monocrystalline silicon, low temperature polycrystalline silicon, and/or amorphous silicon, or may include an oxide semiconductor.

The active layer ACT may include a channel TCH, a first electrode TS, and a second electrode TD of the thin film transistor TFT. The channel TCH of the thin film transistor TFT may be an area that overlaps with a gate electrode TG of the thin film transistor TFT in a third direction DR3, or in other words, a thickness direction of the substrate SUB. The first electrode TS of the thin film transistor TFT may be disposed on one side of the channel TCH, and the second electrode TD may be disposed on another side (e.g., an opposite side) of the channel TCH. The first electrode TS and the second electrode TD of the thin film transistor TFT may be areas that do not overlap with the gate electrode TG in the third direction DR3. The first electrode TS and the second electrode TD of the thin film transistor TFT may be areas having a conductivity by ion doping on the silicon semiconductor or the oxide semiconductor.

The gate insulating layer 130 may be disposed on the active layer ACT. The gate insulating layer 130 may include (e.g., may be formed of) an inorganic layer, for example, such as a silicon nitride layer, a silicon oxynitride layer, a silicon oxide layer, a titanium oxide layer, or an aluminum oxide layer.

The first gate layer GTL1 may be disposed on the gate insulating layer 130. The first gate layer GTL1 may include the gate electrode TG of the thin film transistor TFT, and a first capacitor electrode CAE1. The first gate layer GTL1 may be formed of a single layer or multi-layers including (e.g., made of) any one or more of molybdenum (Mo), aluminum (Al), chromium (Cr), gold (Au), titanium (Ti), nickel (Ni), neodymium (Nd), and copper (Cu), or a suitable alloy thereof.

The first interlayer insulating layer 141 may be disposed on the first gate layer GTL1. The first interlayer insulating layer 141 may include (e.g., may be formed of) an inorganic layer, for example, such as a silicon nitride layer, a silicon oxynitride layer, a silicon oxide layer, a titanium oxide layer, or an aluminum oxide layer.

The second gate layer GTL2 may be disposed on the first interlayer insulating layer 141. The second gate layer GTL2 may include a second capacitor electrode CAE2. The second gate layer GTL2 may include (e.g., may be formed of) a single layer or multi-layers including (e.g., made of) any one or more of molybdenum (Mo), aluminum (Al), chromium (Cr), gold (Au), titanium (Ti), nickel (Ni), neodymium (Nd), and copper (Cu), or a suitable alloy thereof.

The second interlayer insulating layer 142 may be disposed on the second gate layer GTL2. The second interlayer insulating layer 142 may include (e.g., may be formed of) an inorganic layer, for example, such as a silicon nitride layer, a silicon oxynitride layer, a silicon oxide layer, a titanium oxide layer, or an aluminum oxide layer.

The first data metal layer DTL1, which includes a first connection electrode CE1, a first sub-pad, and a data line, may be disposed on the second interlayer insulating layer 142. The data line may be integrally formed with the first sub-pad, but the present disclosure is not limited thereto. The first data metal layer DTL1 may include (e.g., may be formed of) a single layer or multi-layers including (e.g., made of) any one or more of molybdenum (Mo), aluminum (Al), chromium (Cr), gold (Au), titanium (Ti), nickel (Ni), neodymium (Nd), and copper (Cu), or a suitable alloy thereof.

The first connection electrode CE1 may be connected to the first electrode TS or the second electrode TD of the thin film transistor TFT through a first contact hole CT1 that passes through (e.g., penetrates) the first interlayer insulating layer 141 and the second interlayer insulating layer 142.

The first planarization layer 160 may be disposed on the first data metal layer DTL1 to planarize or substantially planarize a step difference due to the active layer ACT, the first gate layer GTL1, the second gate layer GTL2, and the first data metal layer DTL1. The first planarization layer 160 may include (e.g., may be formed of) an organic layer, such as an acrylic resin layer, an epoxy resin layer, a phenolic resin layer, a polyamide resin layer, and/or a polyimide resin layer.

The second data metal layer DTL2 may be disposed on the first planarization layer 160. The second data metal layer DTL2 may include a second connection electrode CE2. The second connection electrode CE2 may be connected to the first connection electrode CE1 through a second contact hole CT2 that passes through (e.g., penetrates) the first planarization layer 160. The second data metal layer DTL2 may include (e.g., may be formed of) a single layer or multi-layers including (e.g., made of) any one or more of molybdenum (Mo), aluminum (Al), chromium (Cr), gold (Au), titanium (Ti), nickel (Ni), neodymium (Nd), and copper (Cu), or a suitable alloy thereof.

The second planarization layer 180 may be disposed on the second data metal layer DTL2. The second planarization layer 180 may include (e.g., may be formed of) an organic layer, such as an acrylic resin layer, an epoxy resin layer, a phenolic resin layer, a polyamide resin layer, and/or a polyimide resin layer.

The third data metal layer DTL3 may be disposed on the second planarization layer 180. The third data metal layer DTL3 may include a third connection electrode CE3 and a third sub-pad. The third connection electrode CE3 may be connected to the second connection electrode CE2 through a third contact hole CT3 that passes through (e.g., penetrates) the second planarization layer 180. The third data metal layer DTL3 may include (e.g., may be formed of) a single layer or multi-layers including (e.g., made of) any one or more of molybdenum (Mo), aluminum (Al), chromium (Cr), gold (Au), titanium (Ti), nickel (Ni), neodymium (Nd), and copper (Cu), or a suitable alloy thereof.

A third planarization layer 190 may be disposed on the third data metal layer DTL3. The third planarization layer 190 may include (e.g., may be formed of) an organic layer, such as an acrylic resin layer, an epoxy resin layer, a phenolic resin layer, a polyamide resin layer, and/or a polyimide resin layer.

The fourth data metal layer DTL4 may be disposed on the third planarization layer 190. The fourth data metal layer DTL4 may include an anode pad electrode APD and a cathode pad electrode CPD. The anode pad electrode APD may be connected to the third connection electrode CE3 through a fourth contact hole CT4 that passes through (e.g., penetrates) the third planarization layer 190. The cathode pad electrode CPD may be supplied with a first power voltage, which may be a low potential voltage. The fourth data metal layer DTL4 may include (e.g., may be formed of) a single layer or multi-layers including (e.g., made of) any one or more of molybdenum (Mo), aluminum (Al), chromium (Cr), gold (Au), titanium (Ti), nickel (Ni), neodymium (Nd), and copper (Cu), or a suitable alloy thereof.

A transparent conductive layer TCO and a fifth sub-pad, which may increase an adhesive force with a first contact electrode CTE1 and a second contact electrode CTE2 of the light emitting element LE, may be disposed on each of the anode pad electrode APD and the cathode pad electrode CPD. The transparent conductive layer TCO and the fifth sub-pad may include (e.g., may be formed of) a transparent conductive oxide, such as indium tin oxide (ITO) and/or indium zinc oxide (IZO).

A passivation layer (e.g., a first passivation layer) PVX may be disposed on the anode pad electrode APD, the cathode pad electrode CPD, and a first pad. The passivation layer PVX may be disposed to cover the anode pad electrode APD, the cathode pad electrode CPD, and an edge of the first pad. The passivation layer PVX may include (e.g., may be formed of) an inorganic layer, for example, such as a silicon nitride layer, a silicon oxynitride layer, a silicon oxide layer, a titanium oxide layer, or an aluminum oxide layer.

In FIG. 4, the light emitting element LE is illustrated as a flip chip type micro LED, in which the first contact electrode CTE1 and the second contact electrode CTE2 are disposed to face the anode pad electrode APD and the cathode pad electrode CPD, respectively. The light emitting element LE may be an inorganic light emitting element including (e.g., made of) an inorganic material, such as GaN. The light emitting element LE may have a length of several μm to several hundred of μm in the first direction DR1, the second direction DR2, and the third direction DR3. For example, the light emitting element LE may have a length of 100 μm or less in the first direction DR1, the second direction DR2, and the third direction DR3.

The light emitting elements LE may be formed by being grown on a semiconductor substrate, such as a silicon wafer. Each of the light emitting elements LE may be transferred directly from the silicon wafer onto the anode pad electrode APD and the cathode pad electrode CPD of the substrate SUB. As another example, each of the light emitting elements LE may be transferred onto the anode pad electrode APD and the cathode pad electrode CPD of the substrate SUB by an electrostatic method using an electrostatic head, or a stamp method using an elastic polymer material, such as PDMS, or silicon as a transfer substrate.

Each of the light emitting elements LE may be a light emitting structure that includes a base substrate SPUB, an n-type semiconductor NSEM, an active layer MQW, a p-type semiconductor PSEM, a first contact electrode CTE1, and a second contact electrode CTE2.

The base substrate SPUB may be a sapphire substrate, but the present disclosure is not limited thereto.

The n-type semiconductor NSEM may be disposed on one surface of the base substrate SPUB. For example, the n-type semiconductor NSEM may be disposed on a lower surface of the base substrate SPUB. The n-type semiconductor NSEM may include (e.g., may be made of) GaN doped with n-type conductive dopants, such as Si, Ge, Sn, and/or the like.

The active layer MQW may be disposed on a portion of one surface of the n-type semiconductor NSEM. The active layer MQW may include a single quantum well structure material or a multiple quantum well structure material. When the active layer MQW includes a multiple quantum well structure material, a plurality of well layers and a plurality of barrier layers may be alternately stacked. In this case, the well layer may include (e.g., may be formed of) InGaN, and the barrier layer may include (e.g., may be formed of) GaN or AlGaN, but these layers are not limited thereto. As another example, the active layer MQW may have a structure in which semiconductor materials having a large band gap energy and semiconductor materials having a small bandgap energy are alternately stacked, and may include other Group III to Group V semiconductor materials depending on a wavelength range of light that is to be emitted.

The p-type semiconductor PSEM may be disposed on one surface of the active layer MQW. The p-type semiconductor PSEM may include (e.g., may be made of) GaN doped with p-type conductive dopants, such as Mg, Zn, Ca, Se, Ba, and/or the like.

The first contact electrode CTE1 may be disposed on the p-type semiconductor PSEM, and the second contact electrode CTE2 may be disposed on another portion of the one surface of the n-type semiconductor NSEM. The other portion of the one surface of the n-type semiconductor NSEM on which the second contact electrode CTE2 is disposed may be disposed to be spaced apart from the portion of the one surface of the n-type semiconductor NSEM on which the active layer MQW is disposed.

The first contact electrode CTE1 and the anode pad electrode APD may be connected (e.g., adhered or attached) to each other through a conductive adhesive member, such as an anisotropic conductive film (ACF) or an anisotropic conductive paste (ACP). As another example, the first contact electrode CTE1 and the anode pad electrode APD may be connected (e.g., adhered to or attached to) each other through a soldering process.

Figure 5:
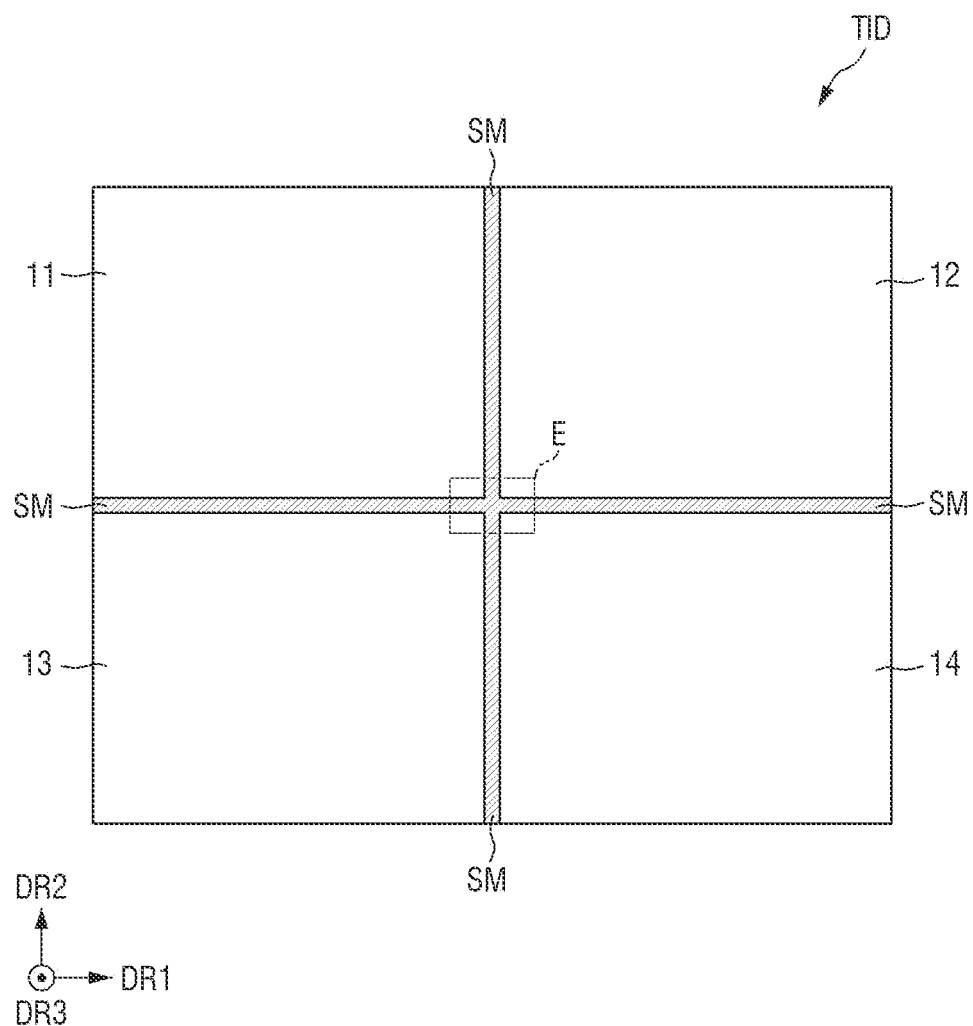
FIG. 5 is a plan view illustrating a tiled display device according to an embodiment.

FIG. 5 is a plan view illustrating a tiled display device according to an embodiment.

Referring to FIG. 5, a tiled display device TID may include a plurality of display devices 11, 12, 13, and 14, and a seam SM. For example, the tiled display device TID may include a first display device 11, a second display device 12, a third display device 13, and a fourth display device 14.

The plurality of display devices 11, 12, 13, and 14 may be arranged in the form of a lattice. The plurality of display devices 11, 12, 13, and 14 may be arranged in M rows (where M is a positive integer) and N columns (where N is a positive integer) in the form of a matrix. For example, the first display device 11 and the second display device 12 may be adjacent to each other in the first direction DR1. The first display device 11 and the third display device 13 may be adjacent to each other in the second direction DR2. The third display device 13 and the fourth display device 14 may be adjacent to each other in the first direction DR1. The second display device 12 and the fourth display device 14 may be adjacent to each other in the second direction DR2.

However, the number and arrangement of the plurality of display devices 11, 12, 13, and 14 in the tiled display device TID are not limited to those shown in FIG. 5. The number and arrangement of the display devices 11, 12, 13, and 14 in the tiled display device TID may be determined depending on a size of each of the display devices 11, 12, 13, and 14, a desired size of the tiled display device TID, and a desired shape of the tiled display device TID.

The plurality of display devices 11, 12, 13, and 14 may have the same or substantially the same size as each other, but the present disclosure is not limited thereto. For example, one or more of the plurality of display devices 11, 12, 13, and 14 may have a different size from the others.

Each of the plurality of display devices 11, 12, 13, and 14 may have a rectangular shape that includes long sides and short sides. The plurality of display devices 11, 12, 13, and 14 may be disposed, such that their long sides or short sides are connected to each other. Some or all of the plurality of display devices 11, 12, 13, and 14 may be disposed at (e.g., in or on) an edge of the tiled display device TID, and may form one side of the tiled display device TID. At least one of the plurality of display devices 11, 12, 13, and 14 may be disposed at (e.g., in or on) at least one edge of the tiled display device TID, and may form two adjacent sides of the tiled display device TID. At least one of the plurality of display devices 11, 12, 13, and 14 may be surrounded (e.g., around a periphery thereof) by the other display devices.

Each of the plurality of display devices 11, 12, 13, and 14 may be the same or substantially the same as the display device DD described above with reference to FIG. 1. Therefore, redundant description of each of the plurality of display devices 11, 12, 13, and 14 may not be repeated.

The seam SM may include a coupling member or an adhesive member. In this case, the plurality of display devices 11, 12, 13, and 14 may be connected to each other through the coupling member or the adhesive member of the seam SM. The seam SM may be disposed between the first display device 11 and the second display device 12, between the first display device 11 and the third display device 13, between the second display device 12 and the fourth display device 14, and between the third display device 13 and the fourth display device 14.

Figure 6:
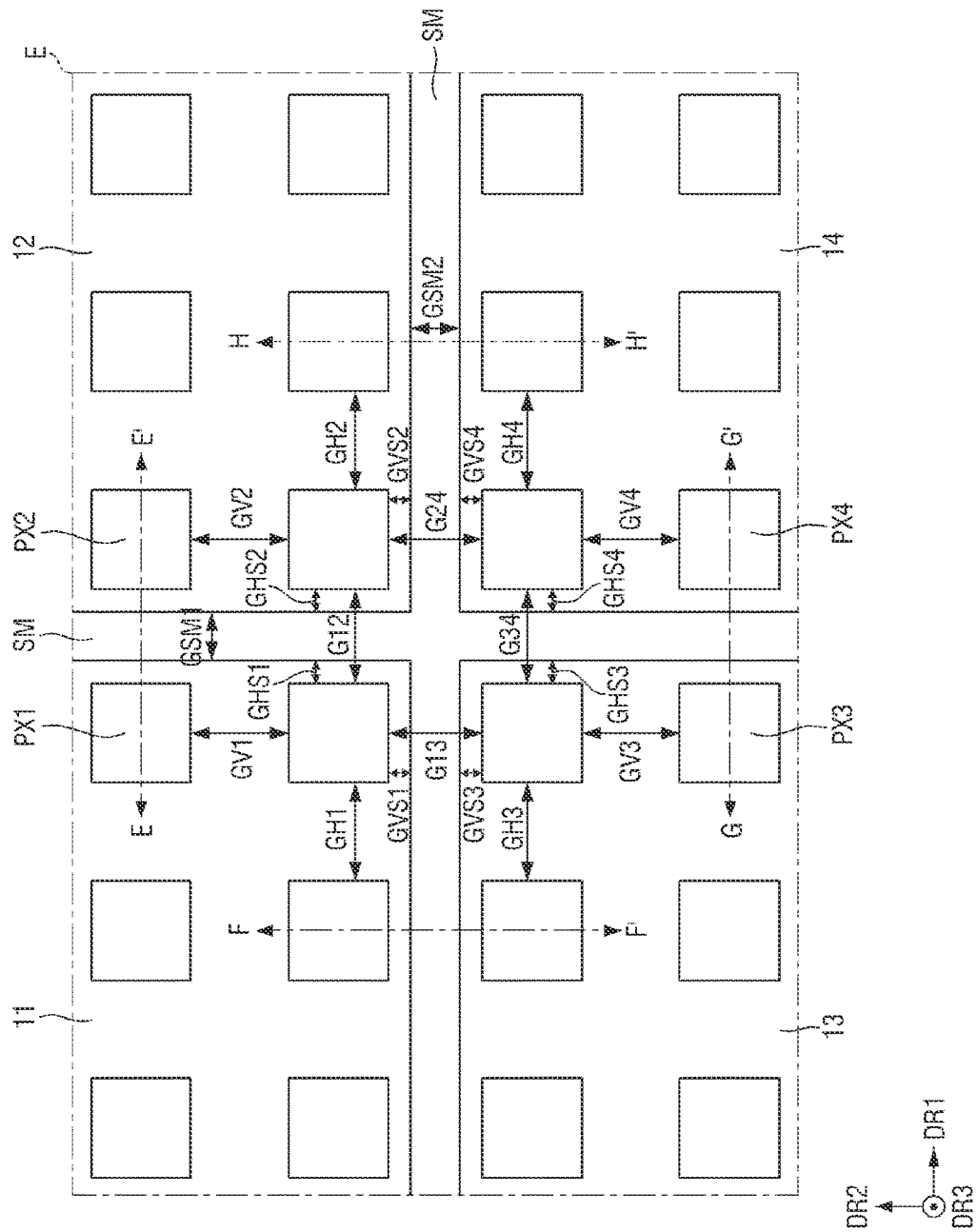
FIG. 6 is an enlarged layout view illustrating the area E of FIG. 5 in more detail.

FIG. 6 is an enlarged layout view illustrating the area E of FIG. 5 in more detail.

Referring to FIG. 6, the seam SM may have a planar shape of a cross or an addition symbol in the central area of the tiled display 20 adjacent to the first display device 11, the second display device 12, the third display device 13, and the fourth display device 14. The seam SM may be disposed between the first display device 11 and the second display device 12, between the first display device 11 and the third display device 13, between the second display device 12 and the fourth display device 14, and between the third display device 13 and the fourth display device 14.

The first display device 11 may include first pixels PX1 arranged in the form of a matrix along the first direction DR1 and the second direction DR2 to display an image. The second display device 12 may include second pixels PX2 arranged in the form of a matrix along the first direction DR1 and the second direction DR2 to display an image. The third display device 13 may include third pixels PX3 arranged in the form of a matrix along the first direction DR1 and the second direction DR2 to display an image. The fourth display device 14 may include fourth pixels PX4 arranged in the form of a matrix along the first direction DR1 and the second direction DR2 to display an image.

A minimum distance between the first pixels PX1 that are adjacent to each other in the first direction DR1 may be defined as a first horizontal gap distance GH1. A minimum distance between the second pixels PX2 that are adjacent to each other in the first direction DR1 may be defined as a second horizontal gap distance GH2. The first horizontal gap distance GH1 and the second horizontal gap distance GH2 may be the same or substantially the same as each other.

The seam SM may be disposed between the first pixel PX1 and the second pixel PX2 that are adjacent to each other in the first direction DR1. A minimum distance G12 between the first pixel PX1 and the second pixel PX2 that are adjacent to each other in the first direction DR1 may be a sum of a minimum distance GHS1 between the first pixel PX1 and the seam SM in the first direction DR1, a minimum distance GHS2 between the second pixel PX2 and the seam SM in the first direction DR1, and a width GSM1 of the seam SM in the first direction DR1.

The minimum distance G12 between the first pixel PX1 and the second pixel PX2 that are adjacent to each other in the first direction DR1, the first horizontal gap distance GH1, and the second horizontal gap distance GH2 may be the same or substantially the same as one another. Thus, the minimum distance GHS1 between the first pixel PX1 and the seam SM in the first direction DR1 may be smaller than the first horizontal gap distance GH1, and the minimum distance GHS2 between the second pixel PX2 and the seam SM in the first direction DR1 may be smaller than the second horizontal gap distance GH2. Also, the width GSM1 of the seam SM in the first direction DR1 may be smaller than the first horizontal gap distance GH1 and/or the second horizontal gap distance GH2.

A minimum distance between the third pixels PX3 that are adjacent to each other in the first direction DR1 may be defined as a third horizontal gap distance GH3. A minimum distance between the fourth pixels PX4 that are adjacent to each other in the first direction DR1 may be defined as a fourth horizontal gap distance GH4. The third horizontal gap distance GH3 and the fourth horizontal gap distance GH4 may be the same or substantially the same as each other.

The seam SM may be disposed between the third pixel PX3 and the fourth pixel PX4 that are adjacent to each other in the first direction DR1. A minimum distance G34 between the third pixel PX3 and the fourth pixel PX4 that are adjacent to each other in the first direction DR1 may be a sum of a minimum distance GHS3 between the third pixel PX3 and the seam SM in the first direction DR1, a minimum distance GHS4 between the fourth pixel PX4 and the seam SM in the first direction DR1, and the width GSM1 of the seam SM in the first direction DR1.

The minimum distance G34 between the third pixel PX3 and the fourth pixel PX4 that are adjacent to each other in the first direction DR1, the third horizontal gap distance GH3, and the fourth horizontal gap distance GH4 may be the same or substantially the same as one another. Thus, the minimum distance GHS3 between the third pixel PX3 and the seam SM in the first direction DR1 may be smaller than the third horizontal gap distance GH3, and the minimum distance GHS4 between the fourth pixel PX4 and the seam SM in the first direction DR1 may be smaller than the fourth horizontal gap distance GH4. Also, the width GSM1 of the seam SM in the first direction DR1 may be smaller than the third horizontal gap distance GH3 and/or the fourth horizontal gap distance GH4.

A minimum distance between the first pixels PX1 that are adjacent to each other in the second direction DR2 may be defined as a first vertical gap distance GV1. A minimum distance between the third pixels PX3 that are adjacent to each other in the second direction DR2 may be defined as a third vertical gap distance GV3. The first vertical gap distance GV1 and the third vertical gap distance GV3 may be the same or substantially the same as each other.

The seam SM may be disposed between the first pixel PX1 and the third pixel PX3 that are adjacent to each other in the second direction DR2. A minimum distance G13 between the first pixel PX1 and the third pixel PX3 that are adjacent to each other in the second direction DR2 may be a sum of a minimum distance GVS1 between the first pixel PX1 and the seam SM in the second direction DR2, a minimum distance GVS3 between the third pixel PX3 and the seam SM in the second direction DR2, and a width GSM2 of the seam SM in the second direction DR2.

The minimum distance G13 between the first pixel PX1 and the third pixel PX3 that are adjacent to each other in the second direction DR2, the first vertical gap distance GV1, and the third vertical gap distance GV3 may be the same or substantially the same as one another. Thus, the minimum distance GVS1 between the first pixel PX1 and the seam SM in the second direction DR2 may be smaller than the first vertical gap distance GV1, and the minimum distance GVS3 between the third pixel PX3 and the seam SM in the second direction DR2 may be smaller than the third vertical gap distance GV3. Also, the width GSM2 of the seam SM in the second direction DR2 may be smaller than the first vertical gap distance GV1 and/or the third vertical gap distance GV3.

A minimum distance between the second pixels PX2 that are adjacent to each other in the second direction DR2 may be defined as a second vertical gap distance GV2. A minimum distance between the fourth pixels PX4 that are adjacent to each other in the second direction DR2 may be defined as a fourth vertical gap distance GV4. The second vertical gap distance GV2 and the fourth vertical gap distance GV4 may be the same or substantially the same as each other.

The seam SM may be disposed between the second pixel PX2 and the fourth pixel PX4 that are adjacent to each other in the second direction DR2. A minimum distance G24 between the second pixel PX2 and the fourth pixel PX4 that are adjacent to each other in the second direction DR2 may be a sum of a minimum distance GVS2 between the second pixel PX2 and the seam SM in the second direction DR2, a minimum distance GVS4 between the fourth pixel PX4 and the seam SM in the second direction DR2, and the width GSM2 of the seam SM in the second direction DR2.

The minimum distance G24 between the second pixel PX2 and the fourth pixel PX4 that are adjacent to each other in the second direction DR2, the second vertical gap distance GV2, and the fourth vertical gap distance GV4 may be the same or substantially the same as one another. Thus, the minimum distance GVS2 between the second pixel PX2 and the seam SM in the second direction DR2 may be smaller than the second vertical gap distance GV2, and the minimum distance GVS4 between the fourth pixel PX4 and the seam SM in the second direction DR2 may be smaller than the fourth vertical gap distance GV4. Also, the width GSM2 of the seam SM in the second direction DR2 may be smaller than the second vertical gap distance GV2 and/or the fourth vertical gap distance GV4.

As shown in FIG. 6, the minimum distance between the pixels of the display devices, which are adjacent to each other, may be the same or substantially the same as the minimum distance between the pixels of each of the display devices, such that the seam SM may be prevented or substantially prevented from being visually recognized between the images that are displayed by the plurality of display devices 11, 12, 13, and 14.

Figure 7:
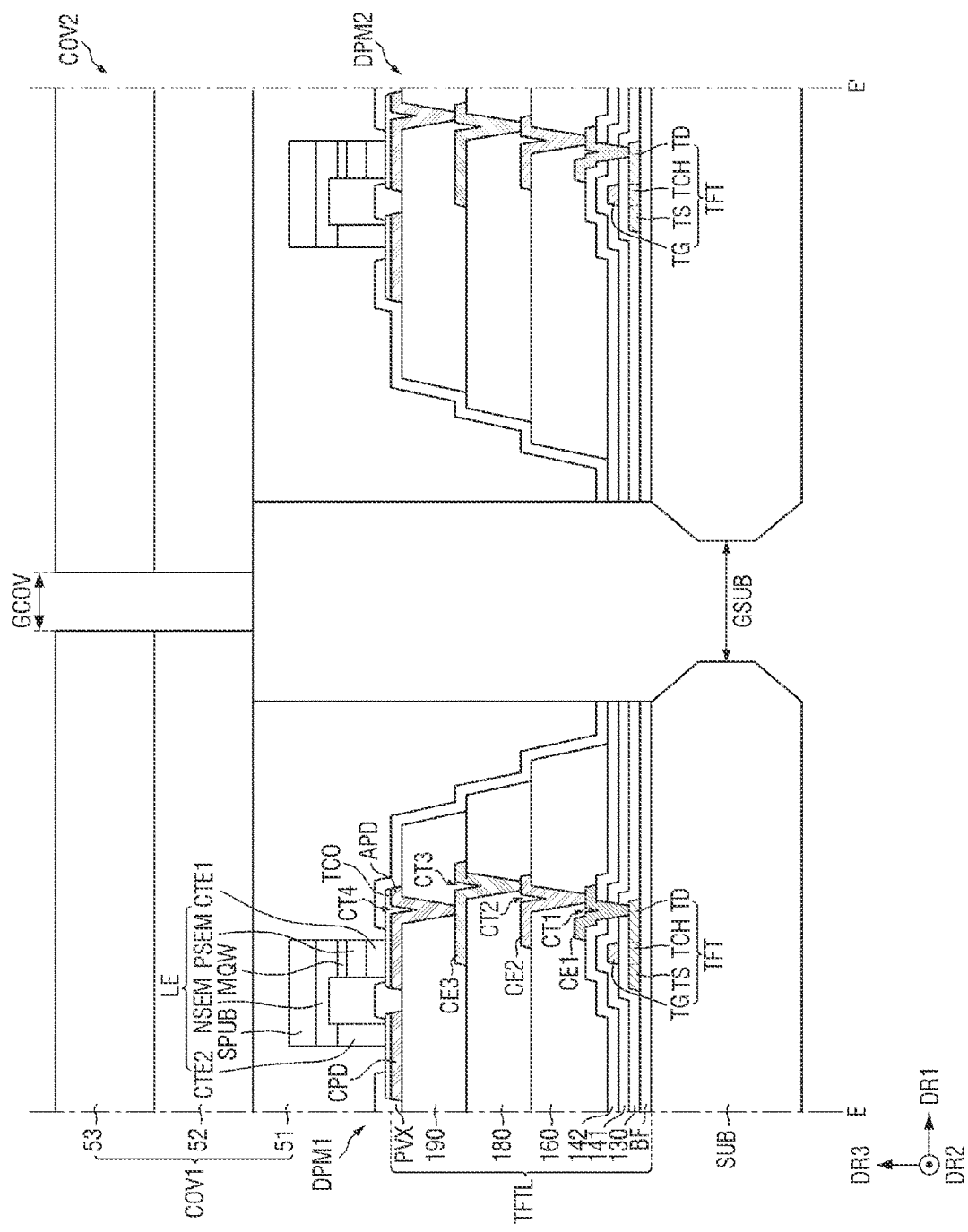
FIG. 7 is a plan view illustrating an example of a tiled display device taken along the line E-E' of FIG. 6.

FIG. 7 is a plan view illustrating an example of the tiled display device taken along the line E-E' of FIG. 6.

Referring to FIG. 7, the first display device 11 includes a first display module (e.g., a first display layer or a first display panel) DPM1 and a first front cover COV1. The second display device 12 includes a second display module (e.g., a second display layer or a second display panel) DPM2 and a second front cover COV2.

Each of the first display module DPM1 and the second display module DPM2 includes a substrate SUB, a thin film transistor layer TFTL, and light emitting elements LE. The thin film transistor layer TFTL and the light emitting element LE may be the same or substantially the same as those described above with reference to FIG. 4, and thus, redundant description thereof may not be repeated.

The first front cover COV1 may be disposed on the substrate SUB. The first front cover COV1 may protrude more than the substrate SUB in the first direction DR1 and the second direction DR2. Therefore, a distance GSUB between the substrate SUB of the first display device 11 and the substrate SUB of the second display device 12 may be greater than a distance GCOV between the first front cover COV1 and the second front cover COV2.

Each of the first front cover COV1 and the second front cover COV2 may include an adhesive member 51, a light transmittance control layer 52 disposed on the adhesive member 51, and an anti-glare layer 53 disposed on the light transmittance control layer 52.

The adhesive member 51 of the first front cover COV1 serves to connect (e.g., attach) a light emitting element layer of the first display module DPM1 and the first front cover COV1 to each other. The adhesive member 51 of the second front cover COV2 serves to attach a light emitting element layer of the second display module DPM2 and the second front cover COV2 to each other. The adhesive member 51 may be a transparent adhesive member capable of transmitting light. For example, the adhesive member 51 may be an optically clear adhesive film or an optically clear resin.

The anti-glare layer 53 may be designed to diffuse a reflection of external light to prevent or substantially prevent the visibility of an image from being deteriorated due to the reflection of the external light. Therefore, a contrast or substantially constant ratio of an image displayed by the first display device 11 and the second display device 12 may be increased due to the anti-glare layer 53.

The light transmittance control layer 52 may be designed to reduce a transmittance of the external light or light reflected from the first display module DPM1 and the second display module DPM2. Therefore, the distance GSUB between the substrate SUB of the first display module DPM1 and the substrate SUB of the second display module DPM2 may be prevented or substantially prevented from being viewed from the outside.

The anti-glare layer 53 may be implemented as a polarizing plate, and the light transmittance control layer 52 may be implemented as a phase delay layer, but the present disclosure is not limited thereto.

An example of the tiled display device taken along the lines F-F', G-G', and H-H' of FIG. 6 may be the same or substantially the same as the example of the tiled display device taken along the line E-E' described above with reference to FIG. 7, and thus, redundant description thereof will not be repeated.

Hereinafter, a module and an apparatus for laser bonding of the display devices will be described with reference to FIGS. 1 to 7.

Figure 8:
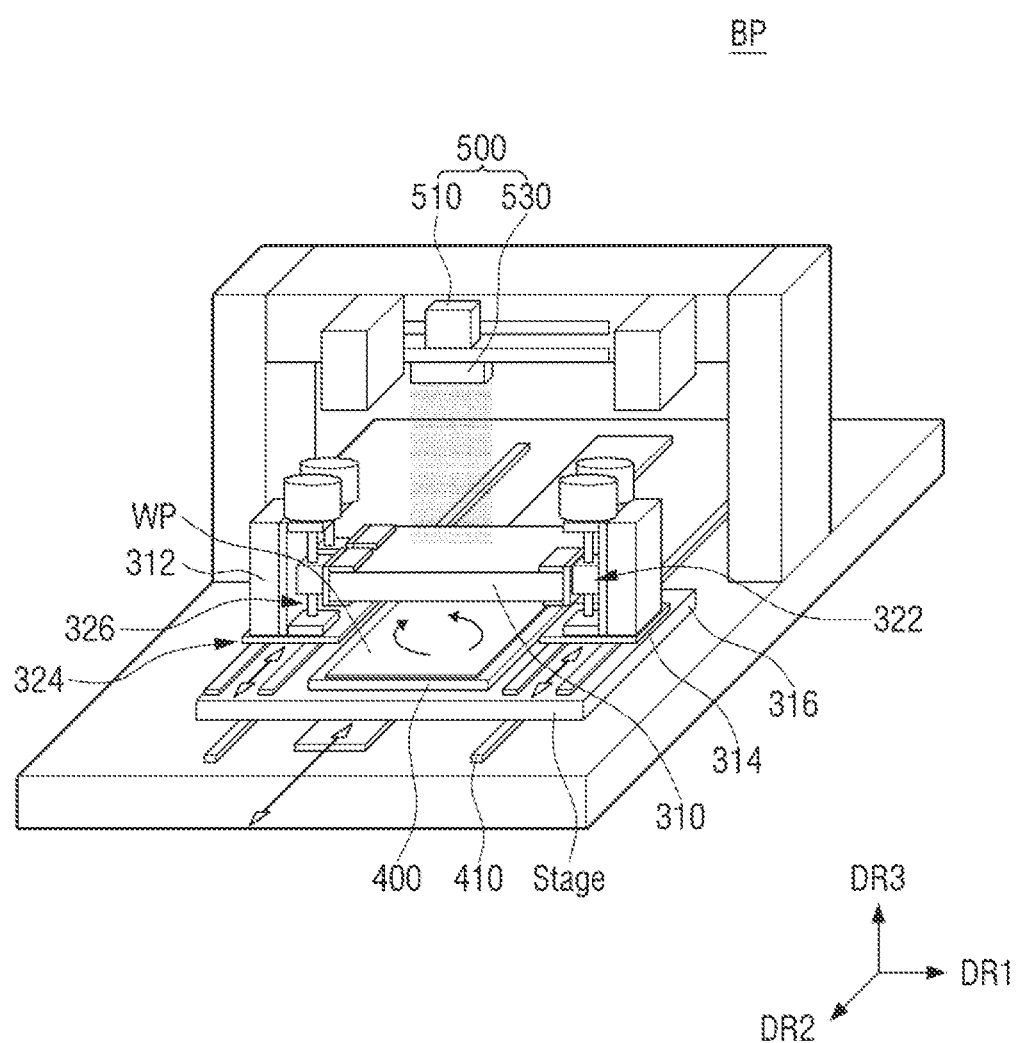
FIG. 8 is a perspective view illustrating a laser pressure bonding apparatus according to an embodiment.
Figure 9:
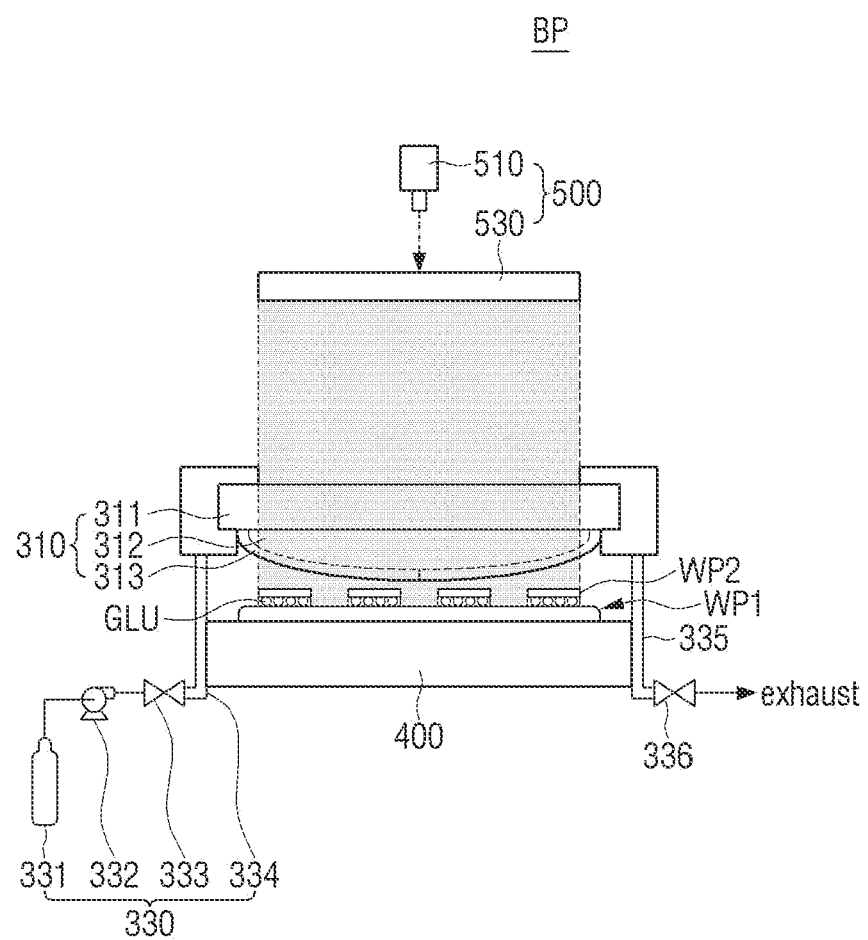
FIG. 9 is a schematic block view illustrating main elements of FIG. 8.

FIG. 8 is a perspective view illustrating a laser pressure bonding apparatus according to an embodiment, and FIG. 9 is a schematic block view illustrating main elements of FIG. 8.

Referring to FIGS. 8 and 9, a laser pressure bonding apparatus RBP may bond two or more bonding targets WP1 and WP2 to each other using a laser beam. The bonding targets WP1 and WP2 may be bonded to each other, and electrically connected to each other. The bonding target WP1 and WP2 may be substrates, films, display panels, touch panels, printed circuit boards, flexible printed circuit boards, or semiconductor devices, such as light emitting elements. According to an embodiment, the first bonding target WP1 may be a substrate and the second bonding target WP2 may be a semiconductor device, but the present disclosure is not limited thereto.

The laser pressure bonding apparatus RBP may include a laser pressure head module (e.g., a laser pressure head or a laser pressure head device) 300, a support member 400, and a laser generator 500.

The laser generator 500 may include a laser light source 510 and an optical system 530.

The laser light source 510 may be a device capable of generating laser light according to energy supplied from the outside. For example, the laser light generated by the laser light source 510 may include a solid laser, such as a YAG laser, a ruby laser, a glass laser, a YVO4 laser, an LD laser, and a fiber laser, a liquid laser, such as a pigment laser, a gas laser, such as a $CO_2$ laser, an excimer laser (e.g., an ArF laser, a KrF laser, an XeCl laser, an XeF laser, or the like), an Ar laser and a He—Ne laser, a semiconductor laser, a free electron laser, and/or the like.

The optical system 530 may receive a beam-shaped laser light from the laser light source 510, and may perform optical dispersion, so that area heating may be performed on a desired area (e.g., a predetermined area).

The laser light emitted from the optical system 530 may be irradiated to the bonding targets WP1 and WP2, and may heat the area (e.g., the predetermined area) of the bonding targets WP1 and WP2. The laser light emitted from the optical system 530 may have a wavelength range of 250 nm to 5 μm, but the present disclosure is not limited thereto.

In some embodiments, a temperature at which an adhesive member GLU disposed between the bonding targets WP1 and WP2 is reflowed may be 150° C. to about 280° C. Therefore, the output of the laser light source 510 may be controlled based on the temperature. The adhesive member GLU may be a non-conductive film (NCF), an anisotropic conductive film (ACF), an instant adhesive, an ultrasonic-curable adhesive, a non-conductive paste (NCP), or the like, but is not particularly limited thereto.

The laser light may allow the bonding targets WP1 and WP2 to be bonded to each other by heating the adhesive member GLU.

The support member 400 has an upper surface that is parallel to or substantially parallel to a plane defined by the first direction DR1 and the second direction DR2, which are perpendicular to or substantially perpendicular to each other. The bonding targets WP1 and WP2 are seated on the upper surface of the support member 400.

The support member 400 and the laser generator 500 may be disposed in a straight or substantially straight line along the third direction DR3 to overlap with each other on the plane (e.g., in a plan view). In other words, the laser beam generated from the laser generator 500 is irradiated toward the support member 400.

The support member 400 is moved to a working position or a standby position by a support transfer unit (e.g., a support transfer structure or device) 410. For example, the support member 400 may be moved in the second direction DR2, or in other words, forward and backward. The support member 400 may be supported by a stage (Stage). The stage (Stage) may movably support the laser pressure head module 300. The stage (Stage) may include the support transfer unit 410 formed to have a longer length (e.g., in the second direction DR2) than that of the support member 400. The support transfer unit 410 may be formed along the second direction DR2, or in other words, a forward and backward direction of the support member 400. The support transfer unit 410 may be a rail-type transfer unit (e.g., may have a rail structure), but the present disclosure is not limited thereto. In another embodiment, the stage (Stage) and the support transfer unit 410 may be omitted as needed or desired.

The laser generator 500 is independently separated from the laser pressure head module 300, so that the laser generator 500 may move to a plurality of irradiation positions on the bonding targets WP1 and WP2 in a state in which the bonding targets WP1 and WP2 are pressed by the laser pressure head module 300. A tact time at one irradiation position may be shortened, and a bonding task for the plurality of irradiation positions may be performed at high speeds.

The laser pressure head module 300 may include a pressure member 310 and a gas supply unit (e.g., a gas supply) 330.

The pressure member 310 may include a first light-transmitting member 311, a second light-transmitting member 313, and a sealed space 312 between the first light-transmitting member 311 and the second light-transmitting member 313. The first light-transmitting member 311 and the second light-transmitting member 313 may be disposed in a straight or substantially straight line to overlap with each other on the plane (e.g., in a plan view).

The pressure member 310 is moved to the working position or the standby position by a first transfer unit (e.g., a first transfer structure or device) 322 and a second transfer unit (e.g., a second transfer structure or device) 324. For example, the first transfer unit 322 may descend or ascend the pressure member 310 in the third direction DR3, and the second transfer unit 324 may move the pressure member 310 in the second direction DR2, or in other words, forward and backward. In addition, a support unit (e.g., a support structure or device) 326 supports the first transfer unit 322 and the second transfer unit 324 to be movable. For example, the support unit 326 may be implemented as a pair of gantries formed to be perpendicular to or substantially perpendicular to the support member 400, and includes an element for supporting the first transfer unit 322 to be movable in the third direction DR3, and an element for supporting the second transfer unit 324 to be movable in the second direction DR2.

The gas supply unit 330 may generate a pressing force by supplying gas to the sealed space 312 between the first light-transmitting member 311 and the second light-transmitting member 313.

The gas supply unit 330 may supply the gas, which may be inert or may have low chemical reactivity (e.g., extremely low chemical reactivity), to the sealed space 312, such as, for example, nitrogen ($N_2$), helium (He), neon (Ne), argon (Ar), carbon dioxide ($CO_2$), or a suitable mixture thereof. Hereinafter, the gases that are inert or have extremely low chemical reactivity will be referred to as neutral gases.

The gas supply unit 330 may include a reservoir 331 for storing the gas, a gas pump 332 for pressurizing and supplying the gas, a gas valve 333 for controlling a flow of the gas, and a gas supply conduit 334 for providing a pathway through which the gas is supplied into the sealed space 312. In addition, the gas supply unit 330 may further include a gas exhaust conduit 335 and an exhaust valve 336 to exhaust the gas used for generating the pressing force in the sealed space 312.

The gas pump 332 may be configured to supply the gas into the sealed space 312 at an elevated pressure relative to an external pressure of the sealed space 312. The gas pump 332 may be configured to supply the gas until the pressure within the sealed space 312 becomes about 0.1 MPa to about 5 MPa based on a gauge pressure.

The gas valve 333 may be closed, such that the supply of the gas is stopped, and an internal pressure of the sealed space 312 is maintained or substantially maintained when the internal pressure of the sealed space 312 is sufficiently high. The gas valve 333 may include (e.g., may be), for example, a ball valve, a globe valve, a gate valve, a control valve, or the like, but is not particularly limited thereto.

The laser light may allow the second bonding targets WP2 to be bonded to the first bonding target WP1 by heating the bonding targets WP1 and WP2, which will be described in more detail below.

The internal pressure of the sealed space 312 may be lowered after the bonding targets WP1 and WP2 are completely processed. Accordingly, the gas exhaust conduit 335 and the exhaust valve 336 may be provided. The exhaust valve 336 may be in a closed state, while the internal pressure of the sealed space 312 is being increased and/or maintained.

Thus, after the bonding targets WP1 and WP2 are completely processed, the exhaust valve 336 may be opened to exhaust the gas in the sealed space 312 to the outside of the sealed space 312 through the gas exhaust conduit 335. The exhaust valve 336 may include (e.g., may be), for example, a ball valve, a globe valve, a gate valve, a control valve, or the like, but is not particularly limited thereto.

For convenience of description, a direction in which the laser beam is irradiated is defined as a lower direction, and an opposite direction of the lower direction is defined as an upper direction. In the present embodiment, the upper direction and the lower direction are parallel with or substantially parallel with the third direction DR3, which is defined as a direction perpendicular to or substantially perpendicular to each of the first direction DR1 and the second direction DR2. The third direction DR3 may be a reference direction for distinguishing a front surface and a rear surface of elements, which will be described in more detail below, from each other. However, the upper direction or the lower direction is a relative concept, and may be converted into other suitable directions.

Figure 10:
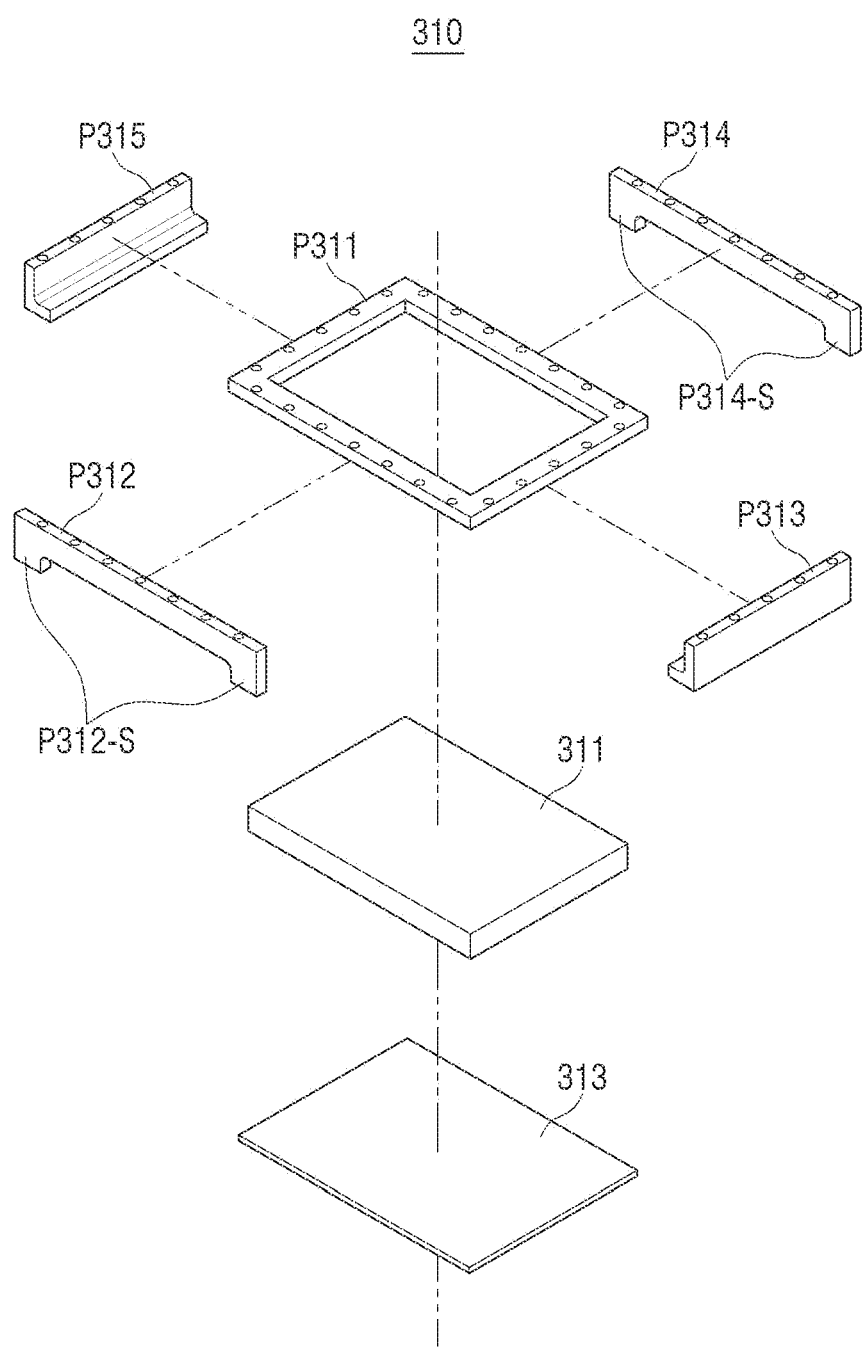
FIG. 10 is an exploded perspective view illustrating a pressure member according to one or more embodiments.
Figure 11:
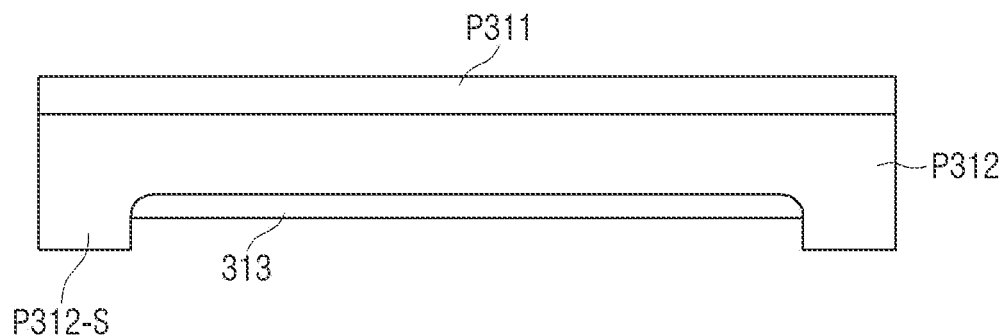
FIG. 11 is a side view illustrating a pressure member according to one or more embodiments.

FIG. 10 is an exploded perspective view illustrating a pressure member according to one or more embodiments, and FIG. 11 is a side view illustrating a pressure member according to one or more embodiments.

Referring to FIGS. 10 and 11, the pressure member 310 may include a frame P310, a first light-transmitting member 311, and a second light-transmitting member 313. The first light-transmitting member 311 and the second light-transmitting member 312 may be accommodated in the frame P310.

The frame P310 may include a main frame P311 having a planar shape of a rectangular frame, and first to fourth side frames P312, P313, P314, and P315 vertically connected to four sides of the main frame P311, respectively.

The main frame P311 has an upper surface that is parallel or substantially parallel with a plane defined by the first direction DR1 and the second direction DR2, which are perpendicular to or substantially perpendicular to each other, and has a rear surface opposite to the upper surface in the third direction DR3.

The main frame P311 of the frame P310 is formed in the form of a rectangular frame having an opening formed to expose one surface of the first light-transmitting member 311. The laser beam irradiated from the laser generator 500 through the opening passes through the first light-transmitting member 311 and the second light-transmitting member 313.

In some embodiments, a light-shielding member may be provided on the upper surface of the main frame P311 having the form of a square or rectangular frame, but the present disclosure is not limited thereto.

The light-shielding member may shield transmission of light. The light-shielding member may include an organic light-shielding material and a liquid repellent component. In this case, the liquid repellent component may include (e.g., may be made of) a fluorine-containing monomer or a fluorine-containing polymer, and in more detail, for example, may include a fluorine-containing aliphatic polycarbonate. For example, the light-shielding member may include (e.g., may be made of) a black organic material containing a liquid repellent component. The light-shielding member may be formed through coating and exposure processes of an organic light-shielding material containing a liquid repellent component.

Some of the first to fourth side frames P312, P313, P314, and P315, for example, such as the second side frame P313 and the fourth side frame P315 that face each other, may be bent in an "L" shape. A first surface of the frame bent in an "L" shape may be perpendicular to or substantially perpendicular to the main frame P311, and may be in contact with a side of the first light-transmitting member 311. A second surface of the frame bent in the "L" shape may be perpendicular to or substantially perpendicular to the first surface, may be parallel or substantially parallel with the main frame P311, and may be in contact with a rear surface of the second light-transmitting member 313. The main frame P311 and the first to fourth side frames P312, P313, P314, and P315 may be screw-coupled to one another, but the present disclosure is not limited thereto.

Some of the first to fourth side frames P312, P313, P314, and P315, for example, such as the first side frame P312 and the third side frame P314 that face each other, may include leg portions P312-S and P314-S protruded downward. The leg portions P312-S and P314-S support the frame P310 outside an irradiation area of the laser beam, while the laser beam is being irradiated. In this case, the irradiation area of the laser beam is an area that the laser beam affects when irradiating the laser in a state in which the laser generator (e.g., 500 of FIG. 9) or the support member (e.g., 400 of FIG. 9) is fixed.

In another embodiment, the main frame P311 and the first to fourth side frames P312, P313, P314, and P315 may be integrally formed with one another.

The first light-transmitting member 311 and the second light-transmitting member 313 are disposed in an accommodating space surrounded (e.g., around a periphery thereof) by the first to fourth side frames P312, P313, P314, and P315. Therefore, the rear surface of the main frame P311 may be in contact with an upper surface of the first light-transmitting member 311, and the first to fourth side frames P312, P313, P314, and P315 may be in contact with the sides of the first light-transmitting member 311 and the second light-transmitting member 313. The main frame P311 and the first light-transmitting member 311 may be disposed in a straight or substantially straight line to overlap with each other in the thickness direction (e.g., the third direction DR3) on the plane (e.g., in a plan view).

While an example shape/structure of the frame P310 has been described above with reference to FIGS. 10 and 11, the present disclosure is not limited thereto. For example, the frame P310 may be implemented as a '⊏' shaped frame capable of supporting the first light-transmitting member 311 and the second light-transmitting member 313.

The first light-transmitting member 311 and the second light-transmitting member 313 may be formed in a rectangular-shaped plane having a long side extending in the first direction DR1 and a short side extending in the second direction DR2. A corner where the long side extending in the first direction DR1 and the short side extending in the second direction DR2 meet each other may be formed at a right angle. The planar shapes of the first light-transmitting member 311 and the second light-transmitting member 313 are not limited to a rectangular-shaped plane, and may be formed in other suitable polygonal shapes, a circular shape, or an elliptical shape.

The first light-transmitting member 311 may include (e.g., may be formed of) a rigid light-transmitting material to pass the laser light emitted from the laser generator 500 therethrough. In this case, light transmittance may be defined as the amount of light energy of the laser light emitted from the laser generator 500 that is allowed to pass, and for example, may be at 80% or more. For example, the first light-transmitting member 311 may include (e.g., may be made of) a material having a transmittance of about 80% or more with respect to light in a wavelength range of about 250 nm to about 5 µm, but the present disclosure is not limited thereto.

The first light-transmitting member 311 may also include (e.g., may be made of) any suitable material capable of withstanding the internal pressure of the sealed space 312, which may be about 0.1 MPa to about 5 MPa, based on the gauge pressure. The first light-transmitting member 311 may include (e.g., may be made of) a suitable material, such as reinforced glass, quartz, acryl, and/or a metal oxide or metalloid oxide, such as silicon oxide and/or aluminum oxide, but the present disclosure is not limited thereto.

The second light-transmitting member 313 is formed of a light-transmitting material having an elasticity to pass the laser light emitted from the laser generator 500 therethrough. For example, the second light-transmitting member 313 may include (e.g., may be formed of) multi-layers of silicon, a silicon-PET (polyethylene terephthalate) stacked layer, or the like, but the present disclosure is not limited thereto.

The second light-transmitting member 313 is expanded in a lower direction, or in other words, in a direction towards the support member 400, by the internal pressure of the sealed space 312, thereby generating a pressing force in the lower direction.

Figure 12:
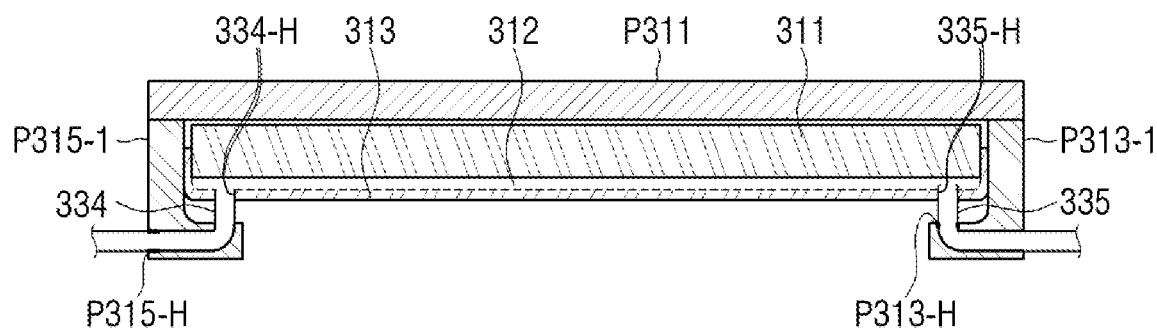
FIG. 12 is a cross-sectional view illustrating a pressure member according to an embodiment.
Figure 13:
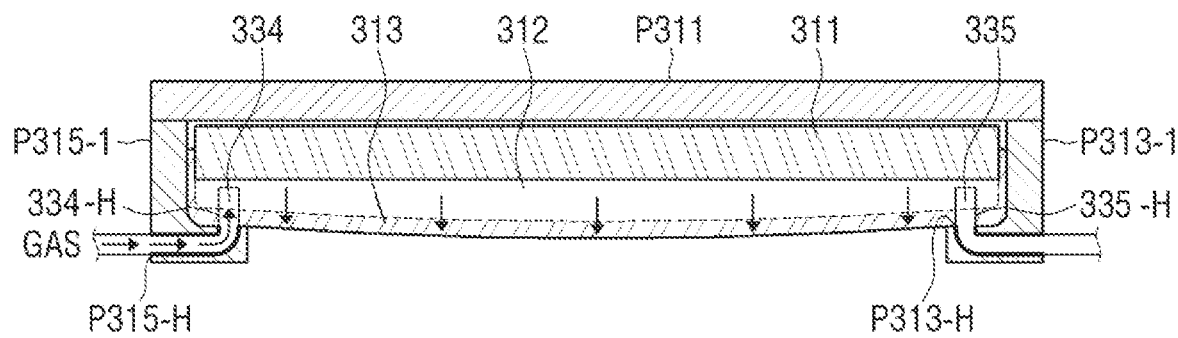
FIG. 13 is a cross-sectional view illustrating gas filling of a pressure member according to an embodiment.
Figure 14:
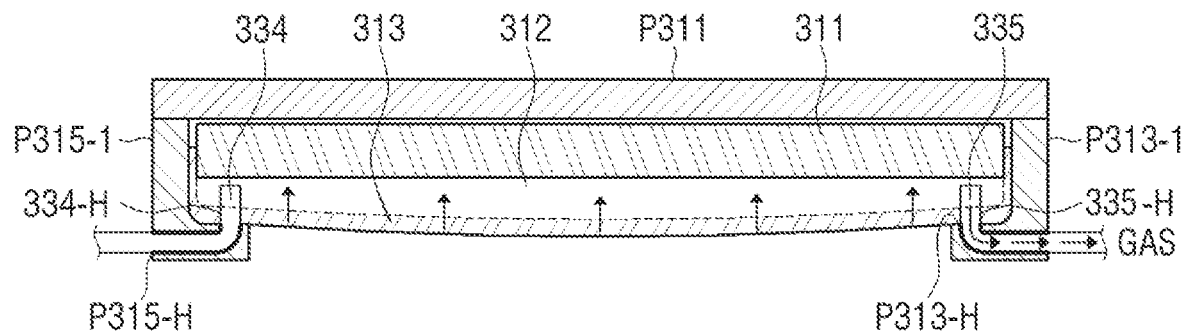
FIG. 14 is a cross-sectional view illustrating gas exhaust of a pressure member according to an embodiment.

FIG. 12 is a cross-sectional view illustrating a pressure member according to an embodiment, FIG. 13 is a cross-sectional view illustrating gas filling of a pressure member according to an embodiment, and FIG. 14 is a cross-sectional view illustrating gas exhaust of a pressure member according to an embodiment.

Referring to FIGS. 12 through 14, one end of the gas supply conduit 334 and one end of the gas exhaust conduit 335 may be provided in the sealed space 312, such that the sealed space 312 between the first light-transmitting member 311 and the second light-transmitting member 313 may be filled with gas.

The gas supply conduit 334 and the gas exhaust conduit 335 may be connected to the sealed space 312 through the second light-transmitting member 313. For example, the second light-transmitting member 313 may include through holes 334-H and 335-H for connecting the gas supply conduit 334 with the gas exhaust conduit 335. The gas supply conduit 334 may be connected to the sealed space 312 through the first through hole 334-H, and the gas exhaust conduit 335 may be connected to the sealed space 312 through the second through hole 335-H.

In addition, some of the first to fourth side frames P312, P313, P314, and P315, for example, such as the second side frame P313-1 and the fourth side frame P315-1, may include through holes P313-H and P315-H for connecting the gas supply conduit 334 with the gas exhaust conduit 335. For example, the gas exhaust conduit 335 may be connected to the sealed space 312 through the third through hole P313-H, and the gas supply conduit 334 may be connected to the sealed space 312 through the fourth through hole P315-H.

Referring to FIG. 13, the gas supply conduit 334 is connected to the sealed space 312 through the fourth through hole P315-H of the fourth side frame P315-1, and the first through hole 334-H of the second light-transmitting member 313. The gas is filled in the sealed space 312 through the gas supply conduit 334. At this time, the gas exhaust conduit 335 may be blocked by the exhaust valve 336 (e.g., see FIG. 9) described above.

Referring to FIG. 14, the gas exhaust conduit 335 is connected to the sealed space 312 through the third through hole P313-H of the second side frame P313-1, and the second through hole 335-H of the second light-transmitting member 313. The gas is exhausted to the outside of the sealed space 312 through the gas exhaust conduit 335. At this time, the gas supply conduit 334 may be blocked by the gas valve 333 (e.g., see FIG. 9) described above.

Figure 15:
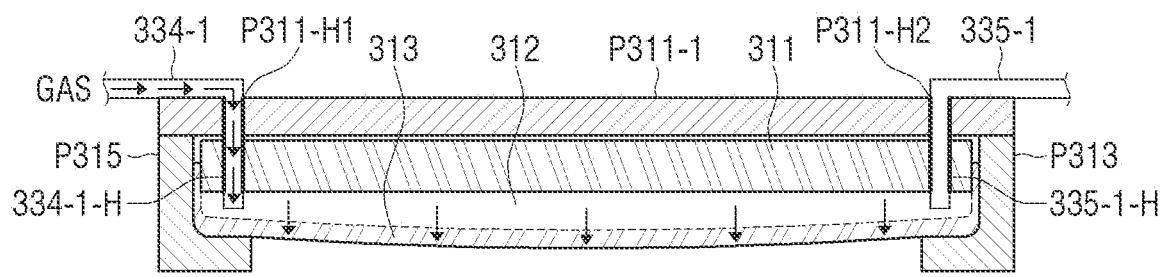
FIG. 15 is a cross-sectional view illustrating gas filling of a laser pressure head module according to another embodiment.
Figure 16:
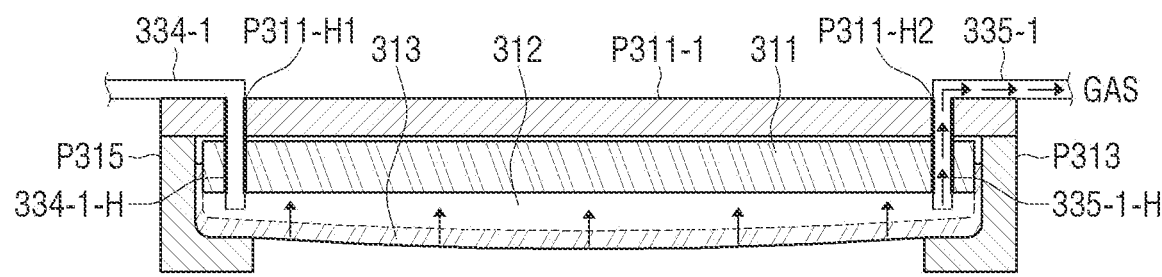
FIG. 16 is a cross-sectional view illustrating gas exhaust of a laser pressure head module according to another embodiment.

FIG. 15 is a cross-sectional view illustrating gas filling of a laser pressure head module according to another embodiment, and FIG. 16 is a cross-sectional view illustrating gas exhaust of a laser pressure head module according to another embodiment.

Referring to FIGS. 15 and 16, one end of a gas supply conduit 334-1 and one end of a gas exhaust conduit 335-1 may be provided in the sealed space 312, such that the sealed space 312 between the first light-transmitting member 311 and the second light-transmitting member 313 may be filled with gas.

The gas supply conduit 334-1 and the gas exhaust conduit 335-1 may be connected to the sealed space 312 through the first light-transmitting member 311. For example, the first light-transmitting member 311 may include through holes 334-1-H and 335-1-H for connecting the gas supply conduit 334-1 with the gas exhaust conduit 335-1. The gas supply conduit 334-1 may be connected to the sealed space 312 through the fifth through hole 334-1-H, and the gas exhaust conduit 335-1 may be connected to the sealed space 312 through the sixth through hole 335-1-H.

The main frame P311-1 may also include through holes P311-H1 and P311-H2 for connecting the gas supply conduit 334-1 with the gas exhaust conduit 335-1. The gas supply conduit 334-1 may be connected to the sealed space 312 through the seventh through hole P311-H1, and the gas exhaust conduit 335-1 may be connected to the sealed space 312 through the eighth through hole P311-H2.

Referring to FIG. 15, the gas supply conduit 334-1 is connected to the sealed space 312 through the seventh through hole P311-H1 of the main frame P311-1, and the fifth through hole 334-1-H of the first light-transmitting member 311. The gas is filled in the sealed space 312 through the gas supply conduit 334-1. At this time, the gas exhaust conduit 335-1 may be blocked by a connected exhaust valve.

Referring to FIG. 16, the gas exhaust conduit 335-1 is connected to the sealed space 312 through the eighth through hole P311-H2 of the main frame P311-1, and the sixth through hole 335-1-H of the first light-transmitting member 311. The gas is exhausted to the outside of the sealed space 312 through the gas exhaust conduit 335-1. At this time, the gas supply conduit 334-1 may be blocked by a connected gas valve.

Figure 17:
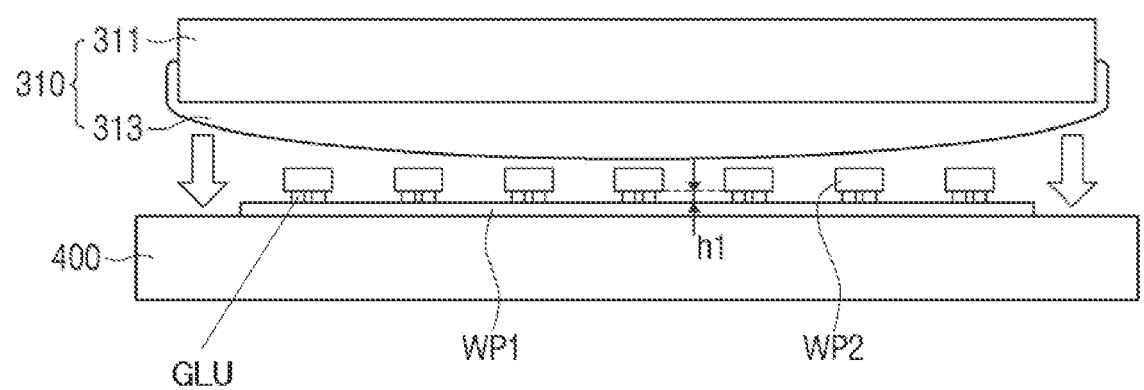
FIGS. 17-18 are side views illustrating a temporal change of bonding targets by gas of a pressure member according to one or more embodiments.
Figure 18:
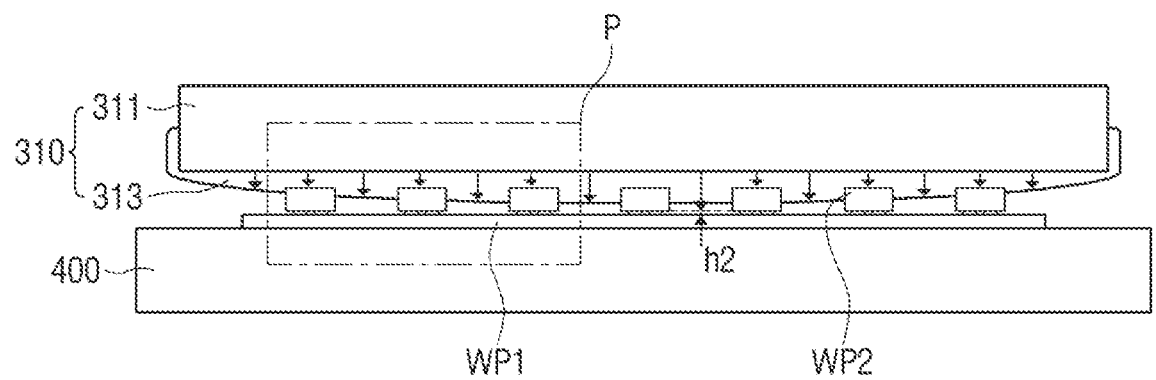
Figure 19:
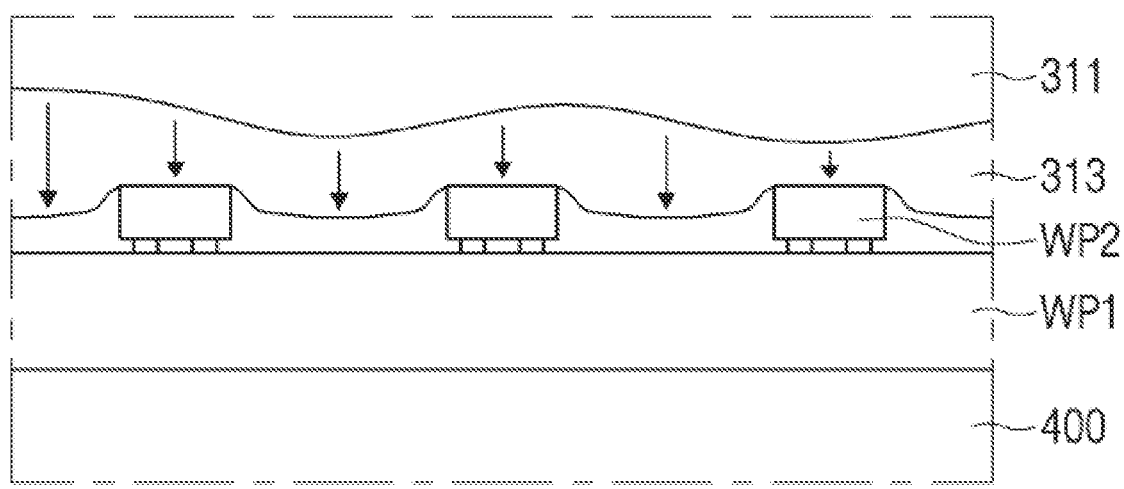
FIG. 19 is an enlarged view of the area P of FIG. 18.

FIGS. 17 and 18 are side views illustrating a temporal change of bonding targets by gas of a pressure member according to one or more embodiments, and FIG. 19 is an enlarged view of the area P of FIG. 18.

Referring to FIGS. 17 and 18, as described above, a first bonding target WP1 may be disposed on the support member 400, a second bonding target WP2 may be disposed on the first bonding target WP1, and an adhesive member GLU may be disposed between the first bonding target WP1 and the second bonding target WP2. For example, the first bonding target WP1 may be any suitable substrate to which the light emitting elements may be bonded, and the second bonding target WP2 may be a semiconductor device, but the present disclosure is not limited thereto.

A distance between the first bonding target WP1 and the second bonding target WP2, which are disposed on the support member 400, may be defined as h1.

When gas is filled in the sealed space 312 between the first light-transmitting member 311 and the second light-transmitting member 313, a pressing force of, for example, 0.1 MPa to 5 MPa, may be generated by the sealed space 312.

The second light-transmitting member 313 is expanded downward, or in other words, in a direction towards the second bonding target WP2, and thus, a uniform or substantially uniform pressure may be applied to a surface of the second bonding target WP2.

A direction of the pressing force provided by the second light-transmitting member 313 to the bonding targets WP1 and WP2 may be the same or substantially the same as a direction in which the laser beam is irradiated onto the support member 400.

When a temperature of the adhesive member GLU is increased by the applied laser, flowability of the adhesive member GLU may be generated or increased as the viscosity thereof is reduced. In another embodiment, the second bonding target WP2 may further include connection terminals. The connection terminals may be disposed on the first bonding target WP1. These connection terminals may include (e.g., may be) solder bumps, and may be attached onto one surface of the second bonding target WP2. The connection terminals may be tin-based solder bumps. In some embodiments, the connection terminals may be one or more selected from among tin (Sn), gold (Au), silver (Ag), platinum (Pt), copper (Cu), bismuth (Bi), palladium (Pd), chromium (Cr), calcium (Ca), nickel (Ni), germanium (Ge), zinc (Zn), manganese (Mn), cobalt (Co), tungsten (W), antimony (Sb), lead (Pb), and any suitable alloy thereof, but the present disclosure is not limited thereto.

As described above, when the second bonding target WP2 includes the connection terminals, a temperature of the connection terminals may be increased by the laser, so that the connection terminals may be gradually reflowed. In some embodiments, the connection terminal may be reflowed at about 150° C. to about 280° C., and the adhesive member GLU may have a flowability at a lower temperature.

Referring to FIG. 18, a distance between the first bonding target WP1 and the second bonding target WP2 may be reduced to h2, as flowability of the adhesive member GLU is increased.

Referring to FIG. 19, thermal deformation may occur on the surface of the first light-transmitting member 311 as a temperature change occurs, and even in this case, the second light-transmitting member 313 may apply a uniform or substantially uniform pressure to the second bonding targets WP2. In addition, warpage may occur on the surface of the second bonding targets WP2 as the temperature changes, but the warpage may be suppressed or substantially suppressed, because the second bonding targets WP2 may receive the externally increased pressure.

As described above, a uniform or substantially uniform pressure is distributed to the second bonding targets WP2 by flatness, deformation, and parallelism of the first light-transmitting member 311, so that a large-sized pressure member 310 may be manufactured.

Figure 20:
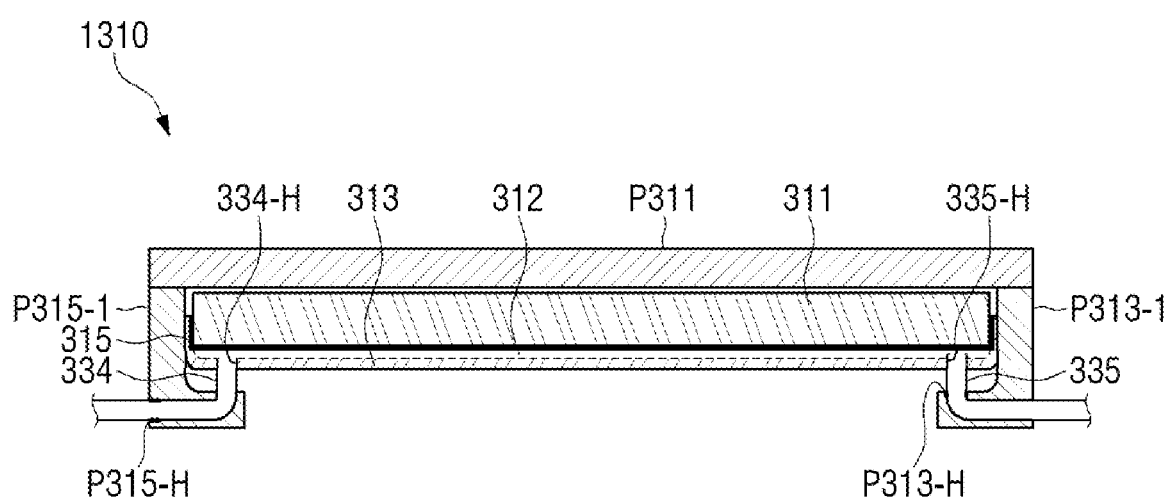
FIG. 20 is a cross-sectional view illustrating a pressure member before gas filling according to another embodiment.
Figure 21:
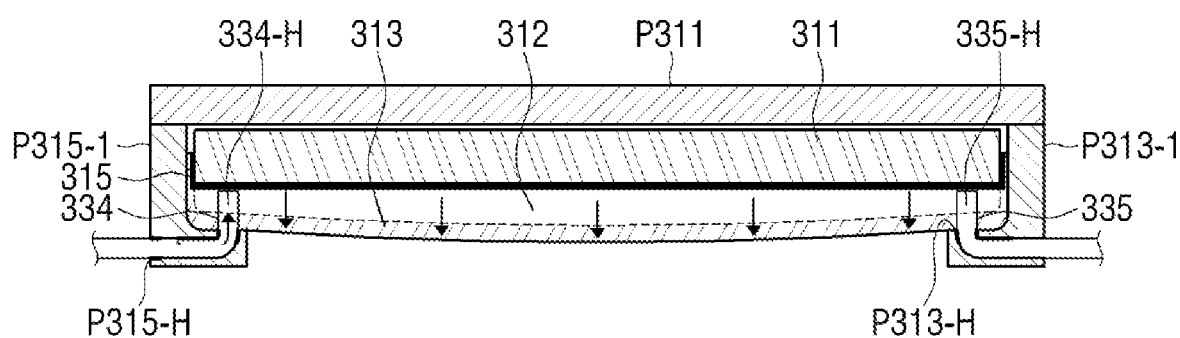
FIG. 21 is a cross-sectional view illustrating a pressure member after gas filling of FIG. 20.

FIG. 20 is a cross-sectional view illustrating a pressure member before gas filling according to another embodiment, and FIG. 21 is a cross-sectional view illustrating a pressure member after gas filling of FIG. 20.

Referring to FIGS. 20 and 21, the pressure member 1310 may include a first light-transmitting member 311, a second light-transmitting member 313, and a third light-transmitting member 315 between the first light-transmitting member 311 and the second light-transmitting member 313. The pressure member 1310 may include a sealed space 312 between the second light-transmitting member 313 and the third light-transmitting member 315.

The first light-transmitting member 311 and the second light-transmitting member 313 may be disposed in a or substantially straight line to overlap with each other on the plane (e.g., in a plan view). In addition, the second light-transmitting member 313 and the third light-transmitting member 315 may be disposed in a straight or substantially straight line to overlap with each other on the plane (e.g., in a plan view).

The first light-transmitting member 311, the second light-transmitting member 313, and the third light-transmitting member 315 may be formed in a rectangular-shaped plane having a long side extending in the first direction DR1, and a short side extending in the second direction DR2 crossing the first direction DR1. A corner where the long side extending in the first direction DR1 and the short side extending in the second direction DR2 meet each other may be formed at a right angle. The planar shapes of the first light-transmitting member 311, the second light-transmitting member 313, and the third light-transmitting member 315 are not limited to a rectangle, but may be formed in other suitable polygonal shapes, a circular shape, or an elliptical shape.

The first light-transmitting member 311 may include (e.g., may be formed of) a rigid light-transmitting material to pass the laser light emitted from the laser generator 500 therethrough.

The first light-transmitting member 311 may be also including (e.g., made of) any suitable material capable of withstanding the internal pressure of the sealed space 312, such as about 0.1 MPa to about 5 MPa, based on the gauge pressure. The first light-transmitting member 311 may include (e.g., may be made of) a suitable material, such as reinforced glass, quartz, acryl, and/or a metal oxide or a metalloid oxide, such as silicon oxide and/or aluminum oxide, but the present disclosure is not limited thereto.

The second light-transmitting member 313 and the third light-transmitting member 315 may include (e.g., may be formed of) a light-transmitting material having an elasticity to pass the laser light emitted from the laser generator 500 therethrough. For example, the second light-transmitting member 313 may include (e.g., may be formed of) multi-layers of silicon, a silicon-PET (polyethylene terephthalate) stacked layer, or the like, but the present disclosure is not limited thereto. The second light-transmitting member 313 and the third light-transmitting member 315 may include (e.g., may be formed of) the same or substantially the same material as each other, but are not limited thereto.

One end of the gas supply conduit 334 and one end of the gas exhaust conduit 335 may be provided in the sealed space 312, such that the sealed space 312 between the second light-transmitting member 313 and the third light-transmitting member 315 may be filled with gas.

The gas supply conduit 334 and the gas exhaust conduit 335 may be connected to the sealed space 312 through the second light-transmitting member 313. Because the configuration in which the gas supply conduit 334 and the gas exhaust conduit 335 are connected to the sealed space 312 may be the same or substantially the same as that described above with reference to FIG. 12, redundant description thereof will not be repeated.

Referring to FIG. 21, the second light-transmitting member 313 is expanded in the lower direction, or in other words, in a direction towards the support member 400, by the internal pressure of the sealed space 312, thereby generating a pressing force in the lower direction.

Figure 22:
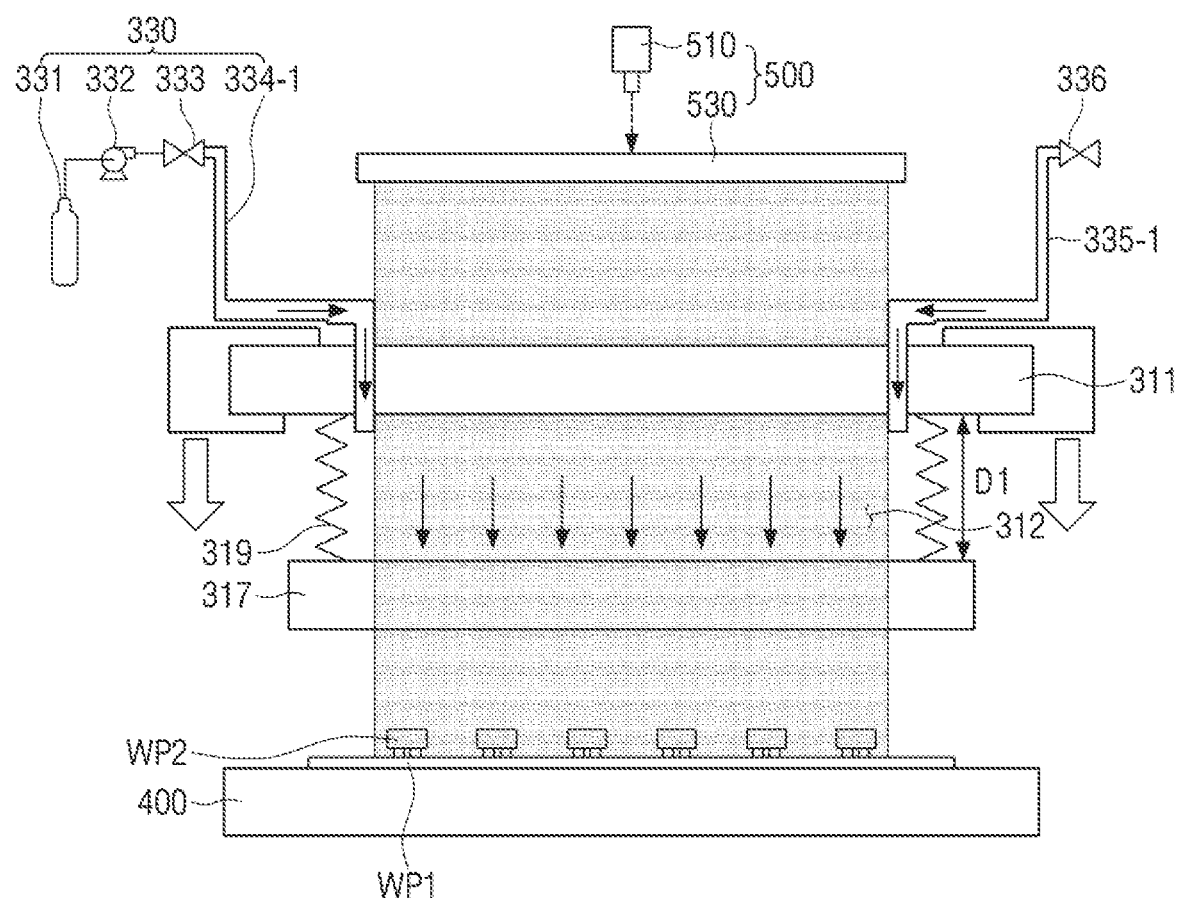
FIG. 22 is a cross-sectional view illustrating a laser pressure head module according to another embodiment.
Figure 23:
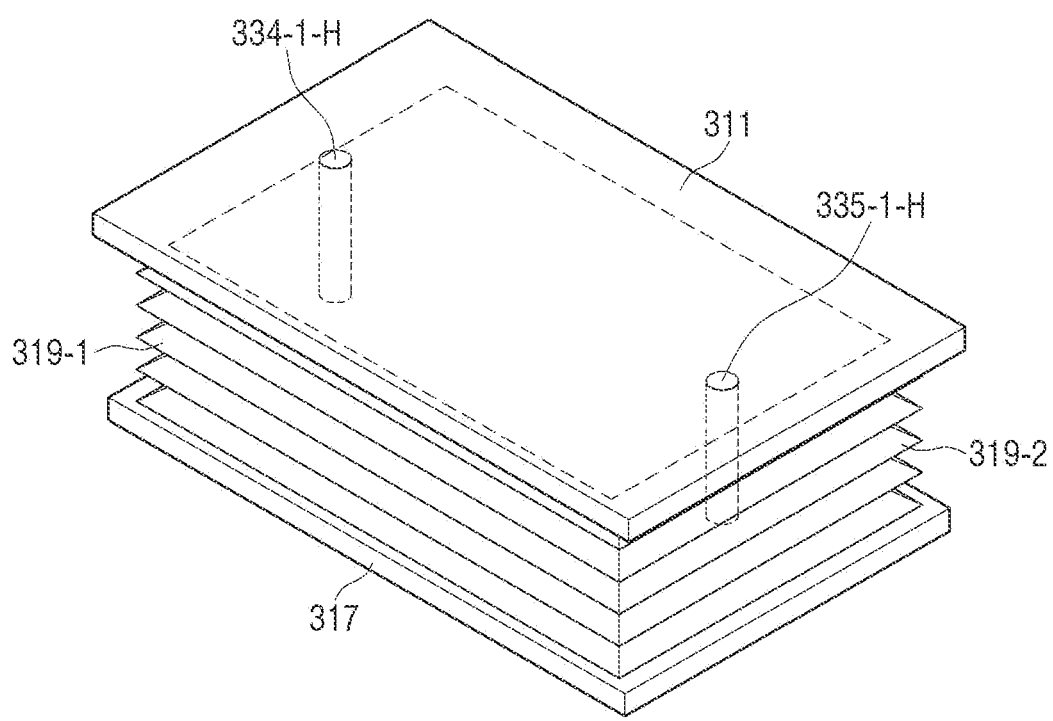
FIG. 23 is a perspective view illustrating a pressure member of FIG. 22.
Figure 24:
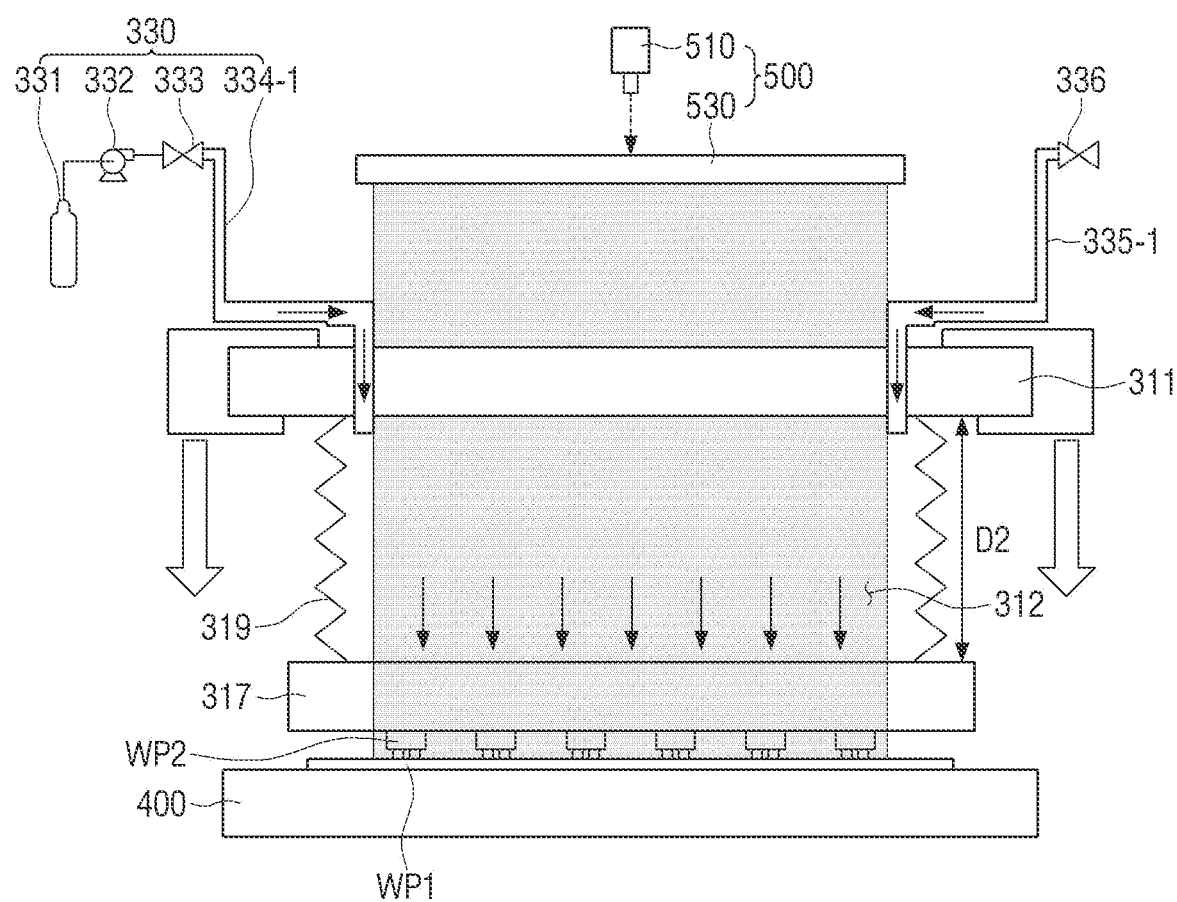
FIG. 24 is a cross-sectional view illustrating elongation of an elongation member of FIG. 22.

FIG. 22 is a cross-sectional view illustrating a laser pressure head module according to another embodiment, FIG. 23 is a perspective view illustrating a pressure member of FIG. 22, and FIG. 24 is a cross-sectional view illustrating elongation of an elongation member of FIG. 22.

Referring to FIGS. 22 and 23, a laser pressure head module (e.g., a laser pressure head or a laser pressure head device) 2300 may include a pressure member 2310 and a gas supply unit (e.g., a gas supply) 330.

The pressure member 2310 may include a first light-transmitting member 311, a second light-transmitting member 317, and an elongation member 319 connecting the first light-transmitting member 311 with the second light-transmitting member 317. The pressure member 2310 may include a sealed space 312 between the first light-transmitting member 311 and the second light-transmitting member 317. The first light-transmitting member 311 and the second light-transmitting member 317 may be disposed in a straight or substantially straight line to overlap with each other on the plane (e.g., in a plan view).

The first light-transmitting member 311 may include (e.g., may be formed of) a rigid light-transmitting material to pass the laser light emitted from the laser generator 500 therethrough. The first light-transmitting member 311 may include (e.g., may be made of) a suitable material, such as reinforced glass, quartz, acryl, and/or a metal oxide or a metalloid oxide, such as silicon oxide and/or aluminum oxide, but the preset disclosure is not limited thereto.

The second light-transmitting member 317 may include (e.g., may be formed of) a rigid light-transmitting material to pass the laser light emitted from the laser generator 500 therethrough. The second light-transmitting member 317 may include (e.g., may be made of) a material such as reinforced glass, quartz, acryl, and metal oxide or metalloid oxide such as silicon oxide and aluminum oxide, but is not limited thereto.

The second light-transmitting member 317 may include (e.g., may be made of) the same or substantially the same material as that of the first light-transmitting member 311.

The first light-transmitting member 311 and the second light-transmitting member 317 may have a rectangular planar shape, but the present disclosure is not limited thereto. The second light-transmitting member 317 may have the same or substantially the same planar shape and/or the same or substantially the same area as those of the first light-transmitting member 311, but the present disclosure is not limited thereto. In another embodiment, the first light-transmitting member 311 may be formed to be wider than the second light-transmitting member 317.

The gas supply unit 330 may supply gas to the sealed space 312 between the first light-transmitting member 311 and the second light-transmitting member 317 to generate a pressing force.

One end of the elongation member 319 may be coupled to (e.g., connected to or attached to) the first light-transmitting member 311, and the other end thereof may be coupled to (e.g., connected to or attached to) the second light-transmitting member 317. The one end of the elongation member 319 is coupled along the circumference of the first light-transmitting member 311, and the other end thereof is coupled along the circumference of the second light-transmitting member 317.

Referring to FIG. 23, in some embodiments, when the first light-transmitting member 311 and the second light-transmitting member 317 have a rectangular planar shape, the elongation member 319 may be connected to four sides of the rectangle, or in other words, along a first side, a second side, a third side, and a fourth side. For example, the elongation member 319 may include a first elongation member 319-1 connected along the first side of the first light-transmitting member 311 and the first side of the second light-transmitting member 317. In addition, the elongation member 319 may include a second elongation member 319-2 connected along the second side of the first light-transmitting member 311 and the second side of the second light-transmitting member 317. Similarly, the elongation member 319 may include a third elongation member connected along the third side of the first light-transmitting member 311 and the third side of the second light-transmitting member 317, and a fourth elongation member connected along the fourth side of the first light-transmitting member 311 and the fourth side of the second light-transmitting member 317. The first elongation member through fourth elongation member may be connected to one another, and thus, may have a closed shape, except for the one end and the other end, which are connected to the first light-transmitting member 311 and the second light-transmitting member 317. Therefore, the elongation member 319 may seal a portion (e.g., the sealed space 312) between the first light-transmitting member 311 and the second light-transmitting member 317.

The elongation member 319 may be elongated in a direction toward the second light-transmitting member 317 as the gas is introduced into the sealed space 312, so that the internal pressure is increased. Therefore, a distance between the first light-transmitting member 311 and the second light-transmitting member 317 may be increased from D1 to D2. The distance D1/D2 between the first light-transmitting member 311 and the second light-transmitting member 317 is a distance between the lowermost surface of the first light-transmitting member 311 and the uppermost surface of the second light-transmitting member 317.

A bellows may be used as the elongation member 319, or a pocket of a flexible material, such as a balloon, may be used as the elongation member 319.

Figure 25:
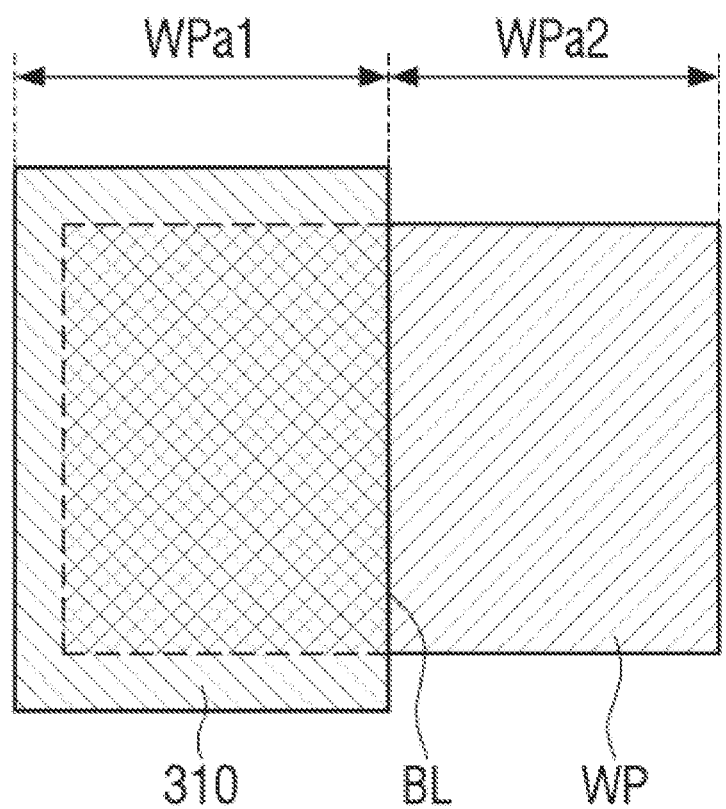
FIG. 25 is a plan view illustrating a pressure member according to another embodiment.
Figure 26:
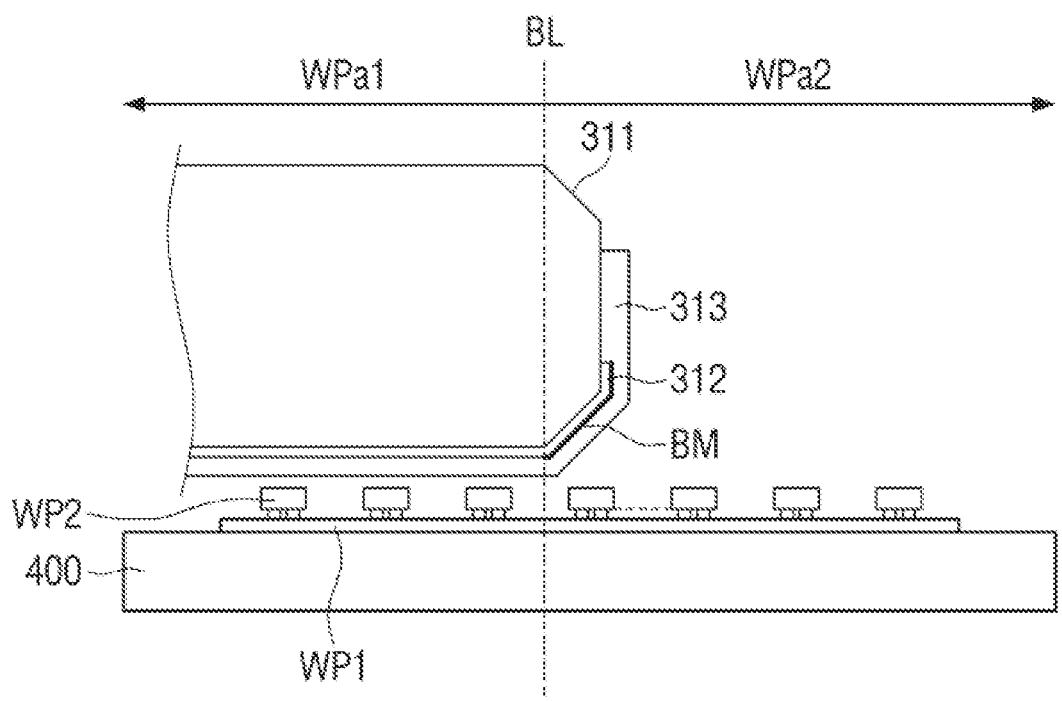
FIG. 26 is an enlarged cross-sectional view illustrating a portion of a side of the pressure member of FIG. 25.
Figure 27:
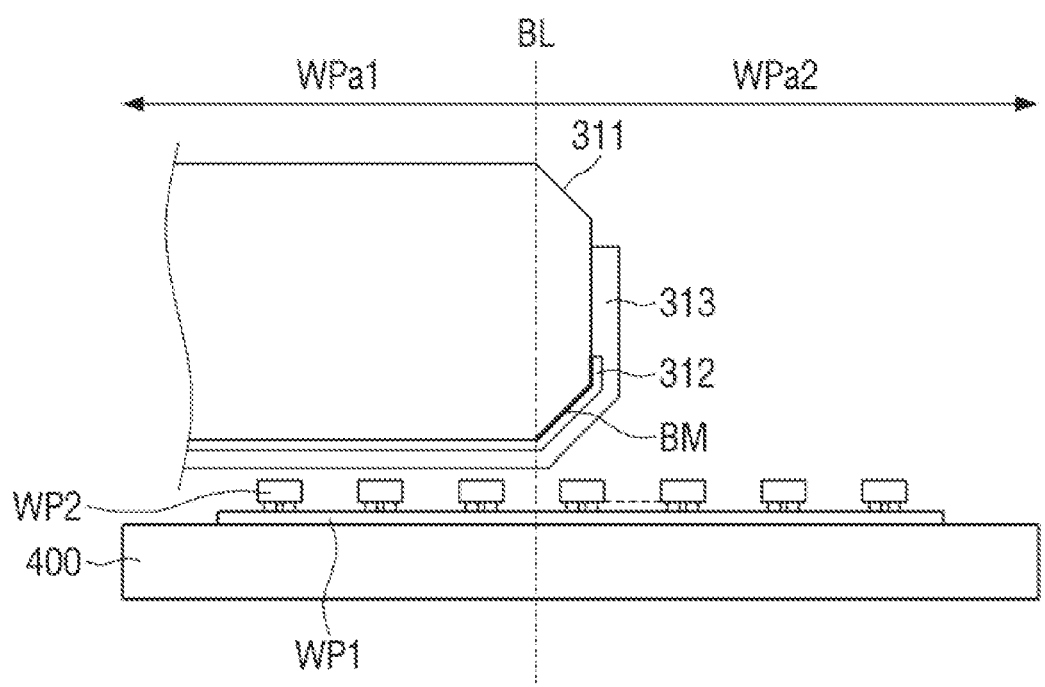
FIG. 27 is an enlarged cross-sectional view illustrating a portion of a side of a pressure member according to another embodiment.

FIG. 25 is a plan view illustrating a pressure member according to another embodiment, FIG. 26 is an enlarged cross-sectional view illustrating a portion of a side of the pressure member of FIG. 25, and FIG. 27 is an enlarged cross-sectional view illustrating a portion of a side of a pressure member according to another embodiment.

As shown in FIGS. 25 and 26, the bonding target WP may have a large area as compared with the pressure member 310.

Therefore, the first bonding target WP1 having the large area may include a first area WPa1 that overlaps with the pressure member 310, and a second area WPa2 that does not overlap with the pressure member 310. The laser beam is irradiated by the laser generator 500 (e.g., see FIG. 9) to the first area WPa1 of the first bonding target WP1 to perform laser bonding. Afterwards, the pressure member 310 and the second area WPa2 are disposed to overlap with each other, and the laser beam is irradiated by the laser generator 500 to the second area WPa2 to perform laser bonding.

In some embodiments, the first light-transmitting member 311 may be formed in a chamber shape, in which an edge of a rear surface thereof facing the second light-transmitting member 313 is cut obliquely. The chamfer shape may be formed on opposite sides of the rear surface of the first light-transmitting member 311. For example, when the first light-transmitting member 311 has a rectangular planar shape as shown in FIG. 10, the chamfer shape may be formed between the rear surface of the first light-transmitting member 311 and each of the first side, the second side, the third side, and the fourth side.

The second light-transmitting member 313 may include a light-shielding material BM disposed on a front surface thereof corresponding to the area in which the chamfer shape of the rear surface of the first light-transmitting member 311 is formed. In this way, the area in which the light-shielding material BM of the second light-transmitting member 313 is formed, which corresponds to the area in which the chamfer shape of the rear surface of the first light-transmitting member 311 is formed, may be referred to as a light-shielding area. The light-shielding material BM may shield transmission of light. The light-shielding material BM may include an organic light-shielding material and a liquid repellent component. In this case, the liquid repellent component may include a fluorine-containing monomer or a fluorine-containing polymer, and in more detail, may include a fluorine-containing aliphatic polycarbonate. For example, the light-shielding material BM may include (e.g., may be made of) a black organic material containing a liquid repellent component.

The light-shielding area may be formed at (e.g., in or on) all sides of the front surface of the second light-transmitting member 313. For example, when the first light-transmitting member 311 has a rectangular planar shape as shown in FIG. 10, the second light-transmitting member 313 may form the light-shielding area on four surfaces corresponding to the chamfer shape formed between the rear surface of the first light-transmitting member 311 and each of the first side, the second side, the third side, and the fourth side.

Referring to FIG. 27, in another embodiment, the light-shielding material BM may be disposed on an edge of the chamfer shape formed between the rear surface of the first light-transmitting member 311 and each of the first side, the second side, the third side, and the fourth side. As described above, the area of the first light-transmitting area 311, which has a chamber shape cut obliquely and in which the light-shielding material BM is disposed, may be referred to as a light-shielding area.

The light-shielding area may be formed on all sides of the rear surface of the first light-transmitting member 311. For example, when the first light-transmitting member 311 has a rectangular planar shape as shown in FIG. 10, the light-shielding area may be formed between the rear surface of the first light-transmitting member 311 and each of the first side, the second side, the third side, and the fourth side.

The light-shielding areas described above do not overlap with the first area Wpa1. In other words, the light-shielding areas described above are positioned outside an area in which the laser bonding is performed, with respect to (e.g., on) a boundary line BL. As a result, unwanted laser irradiation to the second bonding target WP2 of the second area Wpa2 adjacent to the boundary line BL may be avoided during the laser bonding of the first area Wpa1.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A laser pressure head module comprising:
a pressure member comprising:
a first light-transmitting member;
a second light-transmitting member; and
a sealed space between the first light-transmitting member and the second light-transmitting member; and
a gas supply unit configured to supply gas to the sealed space to generate a pressing force,
wherein the second light-transmitting member is configured to be expanded or moved in an external direction by the pressing force.

2. The laser pressure head module of claim 1, wherein the second light-transmitting member overlaps with the first light-transmitting member in a thickness direction.

3. The laser pressure head module of claim 2, wherein the first light-transmitting member includes a rigid material, and the second light-transmitting member includes a first elastic material.

4. The laser pressure head module of claim 3, wherein the first light-transmitting member has a chamfer shape in which an edge of a rear surface of the first light-transmitting member facing the second light-transmitting member has an obliquely cut shape.

5. The laser pressure head module of claim 4, wherein the first light-transmitting member comprises a light-shielding area including a light-shielding material at the edge of the first light-transmitting member having the chamfer shape.

6. The laser pressure head module of claim 4, wherein the second light-transmitting member comprises a light-shielding area including a light-shielding material at an area overlapping with the edge of the first light-transmitting member having the chamfer shape.

7. The laser pressure head module of claim 3, further comprising a third light-transmitting member between the first light-transmitting member and the second light-transmitting member, the third light-transmitting member including a second elastic material,
wherein the sealed space is located between the second light-transmitting member and the third light-transmitting member.

8. The laser pressure head module of claim 7, wherein the first elastic material and the second elastic material are a same elastic material.

9. The laser pressure head module of claim 2, further comprising an elongation member connecting the first light-transmitting member with the second light-transmitting member, and surrounding the sealed space,
wherein the elongation member is configured to be elongated in a direction towards the second light-transmitting member by the pressing force.

10. The laser pressure head module of claim 9, wherein the elongation member comprises a bellows.

11. The laser pressure head module of claim 9, wherein the first light-transmitting member and the second light-transmitting member include a rigid material.

12. The laser pressure head module of claim 11, wherein the second light-transmitting member has a chamfer shape in which an edge of one surface of the second light-transmitting member has an obliquely cut shape.

13. The laser pressure head module of claim 12, wherein the second light-transmitting member comprises a light-shielding area including a light-shielding material at the edge of the second light-transmitting member having the chamfer shape.

14. The laser pressure head module of claim 1, wherein the pressing force is 0.5 Mpa to 1 MPa.

15. The laser pressure head module of claim 1, wherein the gas supply unit comprises:
a reservoir configured to store the gas;
a gas pump configured to supply the gas by pressurizing the gas;
a gas valve configured to control a flow of the gas; and
a gas supply conduit providing a path through which the gas is supplied into the sealed space.

16. The laser pressure head module of claim 15, wherein at least one of the first light-transmitting member or the second light-transmitting member has a through hole for connecting the gas supply conduit with the sealed space.

17. A laser bonding apparatus comprising:
a support member having an upper surface extending in a first direction and a second direction crossing the first direction, the support member configured to receive bonding targets seated on the upper surface;
a pressure member on an upper portion of the support member, the pressure member comprising:
a first light-transmitting member;
a second light-transmitting member; and
a sealed space between the first light-transmitting member and the second light-transmitting member;
a gas supply unit configured to supply gas to the sealed space to generate a pressing force; and
a laser generator on the pressure member, and configured to irradiate a laser beam to the bonding targets in a third direction crossing the first and second directions,
wherein the second light-transmitting member is configured to be expanded or moved in an external direction by the pressing force to press the bonding targets.

18. The laser bonding apparatus of claim 17, wherein the first light-transmitting member and the second light-transmitting member overlap with the support member in a plan view.

19. The laser bonding apparatus of claim 18, wherein the first light-transmitting member includes a rigid material, and the second light-transmitting member includes a first elastic material.

20. The laser bonding apparatus of claim 19, further comprising a third light-transmitting member between the first light-transmitting member and the second light-transmitting member, and including a second elastic material,
wherein the sealed space is located between the second light-transmitting member and the third light-transmitting member.

21. The laser bonding apparatus of claim 18, further comprising an elongation member connecting the first light-transmitting member with the second light-transmitting member, and surrounding the sealed space,
wherein the elongation member is configured to be elongated in a direction towards the second light-transmitting member by the pressing force.

22. The laser bonding apparatus of claim 21, wherein the first light-transmitting member and the second light-transmitting member include a rigid material.

23. The laser bonding apparatus of claim 18, further comprising a frame having an accommodating space for accommodating the first light-transmitting member and the second light-transmitting member, and an opening exposing one surface of the first light-transmitting member.

24. The laser bonding apparatus of claim 23, wherein the frame comprises:
- a main frame having a rectangular frame shape surrounding the opening; and
- four side frames vertically connected to four sides of the main frame to form the accommodating space.

25. The laser bonding apparatus of claim 24, wherein the main frame comprises a light-shielding member on an upper surface facing a laser irradiating direction of the laser generator.

26. The laser bonding apparatus of claim 17, wherein the bonding targets comprise:
- a first bonding target;
- a second bonding target on the first bonding target; and
- an adhesive member adhering the first bonding target to the second bonding target.

27. The laser bonding apparatus of claim 26, wherein the laser generator is configured to heat an area of a bonding target from among the bonding targets.

28. The laser bonding apparatus of claim 27, wherein the laser generator is configured to irradiate a laser beam to the bonding target from among the bonding targets, while the second light-transmitting member is pressing the bonding targets.

* * * * *